(12) United States Patent
Kischkat

(10) Patent No.: US 12,218,485 B2
(45) Date of Patent: Feb. 4, 2025

(54) MID-IR EXTERNAL CAVITY QUANTUM CASCADE LASER WITH A WAVELENGTH-ADJUSTABLE INTERFERENCE FILTER

(71) Applicant: Jan F. Kischkat, Berlin (DE)

(72) Inventor: Jan F. Kischkat, Berlin (DE)

( * ) Notice: Subject to any disclaimer, the term of this patent is extended or adjusted under 35 U.S.C. 154(b) by 797 days.

(21) Appl. No.: 16/976,098

(22) PCT Filed: Feb. 28, 2019

(86) PCT No.: PCT/EP2019/055037
§ 371 (c)(1),
(2) Date: Aug. 27, 2020

(87) PCT Pub. No.: WO2019/166575
PCT Pub. Date: Sep. 6, 2019

(65) Prior Publication Data
US 2020/0412093 A1 Dec. 31, 2020

(30) Foreign Application Priority Data
Feb. 28, 2018 (EP) .................................... 18159180

(51) Int. Cl.
*H01S 5/14* (2006.01)
*H01S 5/02325* (2021.01)
(Continued)

(52) U.S. Cl.
CPC .......... *H01S 5/141* (2013.01); *H01S 5/02325* (2021.01); *H01S 5/0654* (2013.01);
(Continued)

(58) Field of Classification Search
CPC .... H01S 5/141; H01S 5/02325; H01S 5/0654; H01S 5/3401; H01S 5/3402;
(Continued)

(56) References Cited

U.S. PATENT DOCUMENTS

| 5,949,801 A | 9/1999 | Tayebati |
| 6,205,159 B1 | 3/2001 | Sesko |

(Continued)

FOREIGN PATENT DOCUMENTS

| CN | 102780158 | 11/2012 |
| JP | 2012108370 | 6/2012 |
| KR | 20070028463 | 3/2007 |

OTHER PUBLICATIONS

Certificate of Correction issued by the USPTO in respect of U.S. Pat. No. 6,665,321, dated Dec. 16, 2003.
(Continued)

*Primary Examiner* — M. A. Golub-Miller
(74) *Attorney, Agent, or Firm* — JMB DAVIS BEN-DAVID

(57) ABSTRACT

The invention relates to a wavelength-switchable, semiconductor laser (10), for generating of laser light in the optical range between 1 μm and 100 μm, wherein the laser (10) comprises an external cavity (11) and at least the following components: a semiconductor optical amplifier (12), comprising an intra-cavity facet (121) facing towards; a first optical element (13) for collimating a laser beam exiting the intra-cavity facet (121) arranged at the intra-cavity facet (121) of the semiconductor optical amplifier (12); a transmissive, wavelength-adjustable interference filter (1), comprising at least i) a wavelength-adjustable Fabry-Perot filter (100) and ii) a Fabry-Perot etalon (110) comprising a first planar surface (111) and a second planar (112) surface, wherein the first and second surface (111, 112) of the etalon (110) are arranged opposite and plane-parallel to each other and delimit an etalon cavity (113); wherein the Fabry-Perot etalon (110) and the Fabry-Perot filter (100) are arranged in a row; wherein the interference filter (1) is arranged between the first optical element (13) and the beam splitter (14), and wherein the components are arranged such that laser light
(Continued)

Figure 9A:
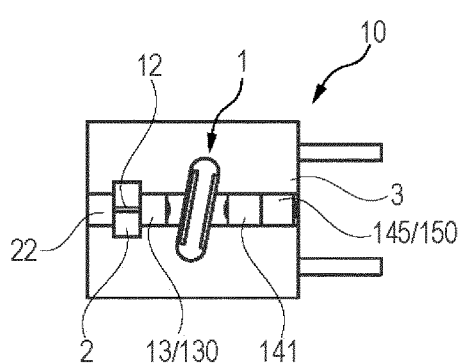

comprising a selected laser wavelength can stably resonate in the external cavity, wherein an on-axis, retro-reflecting beam splitter (14) is arranged at one end of the external cavity (11). Furthermore, the invention relates to a method for selecting a laser wavelength using the laser.

13 Claims, 4 Drawing Sheets

(51) Int. Cl.
    *H01S 5/065*     (2006.01)
    *H01S 5/34*      (2006.01)
    *H01S 5/0222*    (2021.01)
    *H01S 5/024*     (2006.01)
    *H01S 5/028*     (2006.01)
    *H01S 5/10*      (2021.01)

(52) U.S. Cl.
    CPC .......... *H01S 5/3401* (2013.01); *H01S 5/3402* (2013.01); *H01S 5/0222* (2013.01); *H01S 5/02415* (2013.01); *H01S 5/02476* (2013.01); *H01S 5/0287* (2013.01); *H01S 5/1085* (2013.01); *H01S 2302/02* (2013.01)

(58) Field of Classification Search
    CPC ............... H01S 5/0222; H01S 5/02415; H01S 5/02476; H01S 5/0287; H01S 5/1085; H01S 2302/02
    See application file for complete search history.

(56) References Cited

U.S. PATENT DOCUMENTS

| | | | |
|---|---|---|---|
| 6,252,718 B1* | 6/2001 | Lefevre | G02B 5/12 359/629 |
| 6,301,274 B1 | 10/2001 | Tayebati | |
| 6,507,593 B1* | 1/2003 | Spinelli | H01S 5/142 372/98 |
| 6,665,321 B1 | 12/2003 | Sochava | |
| 6,724,790 B1* | 4/2004 | Daiber | H01S 5/0687 372/20 |
| 6,853,654 B2* | 2/2005 | McDonald | G02B 5/284 372/99 |
| 7,406,107 B2 | 7/2008 | Flanders | |
| 2002/0172239 A1* | 11/2002 | McDonald | G02B 5/281 372/20 |
| 2004/0258107 A1* | 12/2004 | Sherrer | H01S 5/141 372/19 |
| 2006/0182156 A1* | 8/2006 | Owen | H01S 3/137 372/19 |
| 2007/0002922 A1 | 1/2007 | McDonald | |
| 2009/0257460 A1 | 10/2009 | Mizutani | |
| 2012/0008650 A1* | 1/2012 | Poustie | H01S 5/028 372/20 |
| 2012/0294321 A1 | 11/2012 | Ma et al. | |
| 2015/0160126 A1 | 6/2015 | Carangelo | |
| 2017/0293085 A1* | 10/2017 | Matsuda | H01S 5/142 |
| 2018/0115136 A1* | 4/2018 | Delfyett | H01S 3/1062 |
| 2020/0350743 A1* | 11/2020 | Ma | G02B 5/288 |
| 2021/0255394 A1* | 8/2021 | Hassan | H01S 5/142 |

OTHER PUBLICATIONS

Thompson, D.J. and Scholten, R.E., 2012. Narrow linewidth tunable external cavity diode laser using wide bandwidth filter. Review of scientific instruments, 83(2), p. 023107.
"OSEC—A Miniaturized, Widely Tunable Optically Stable External-Cavity Quantum-Cascade Laser for the Mid-Infrared".
"Berthold Leibinger Awards Honor Laser Research at the Limits" https://www.photonics.com/Articles/Berthold_Leibinger_Awards_Honor_Laser_Research_at/a69354 (Oct. 2023).
Zhang Guowei et al, "Tunable Laser Technology", National Defense Industry Press, 2002, pp. 205-206.

* cited by examiner

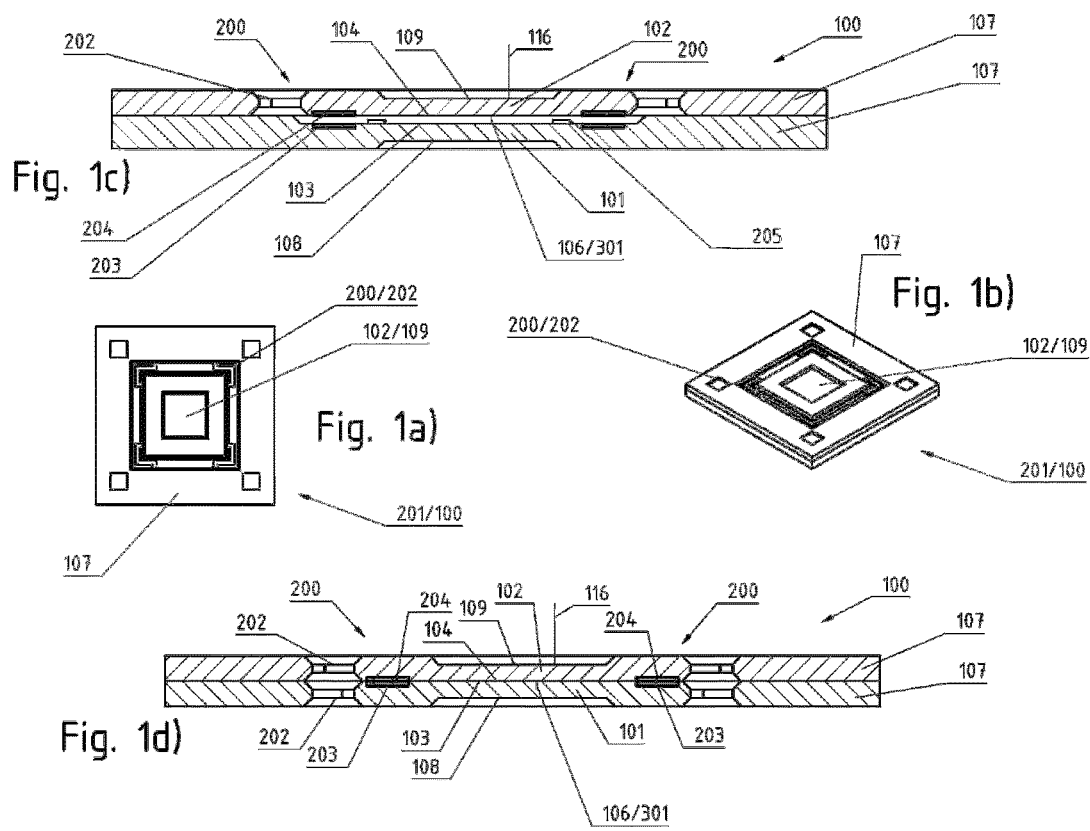
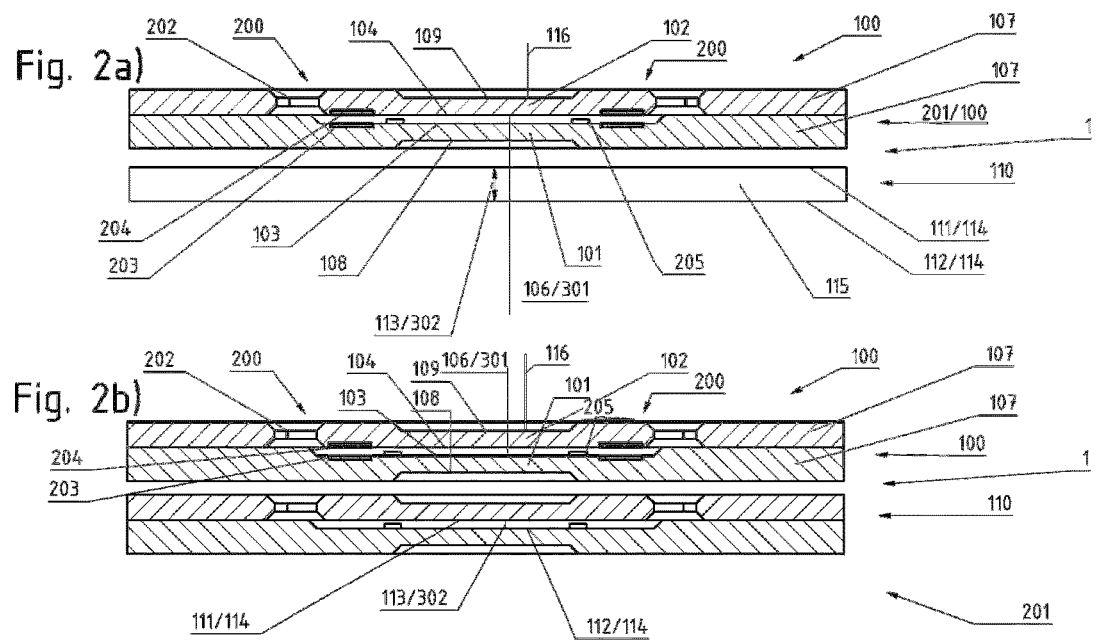

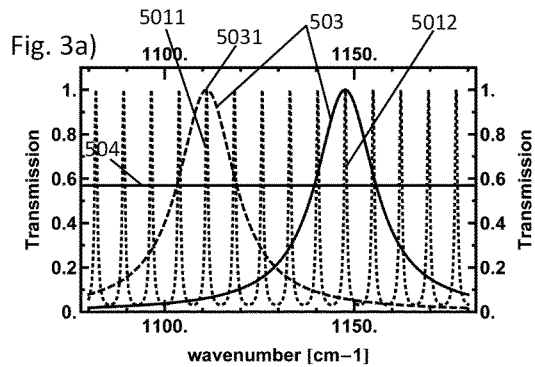
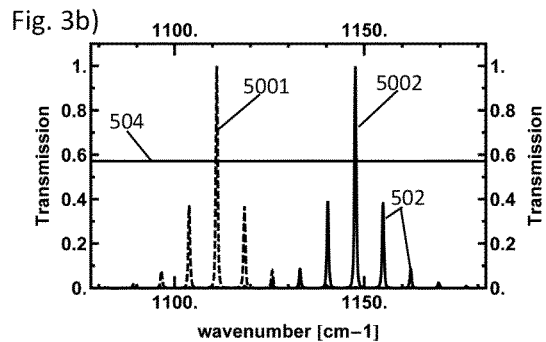
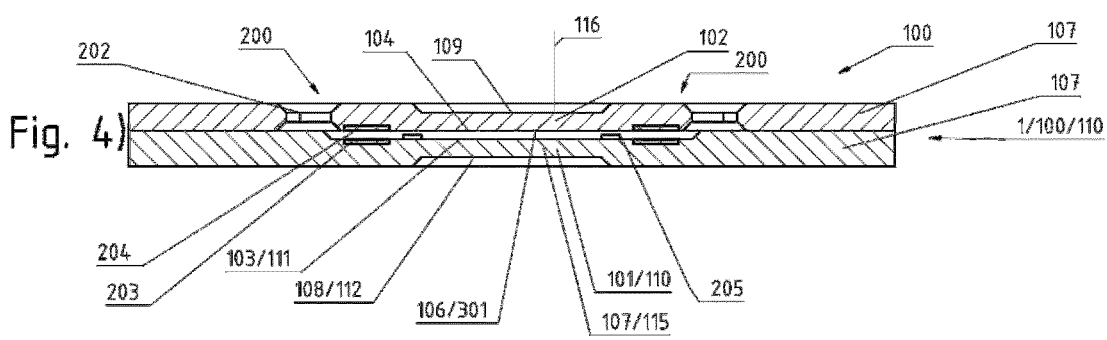
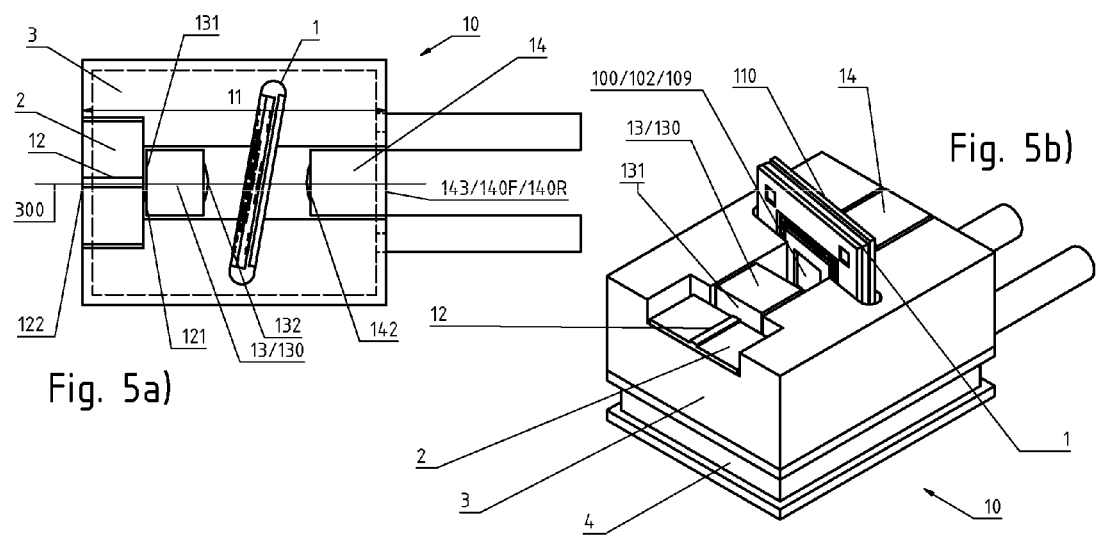

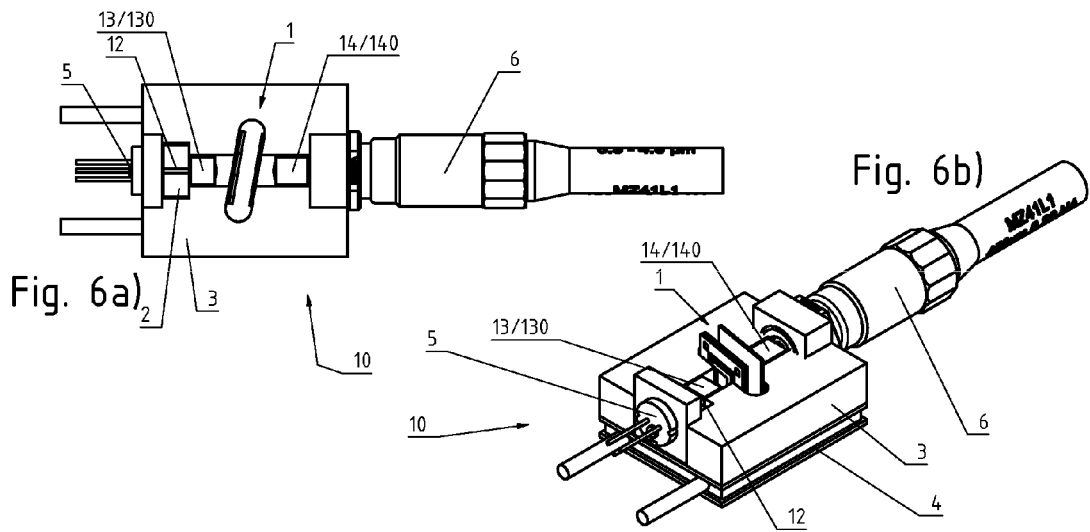
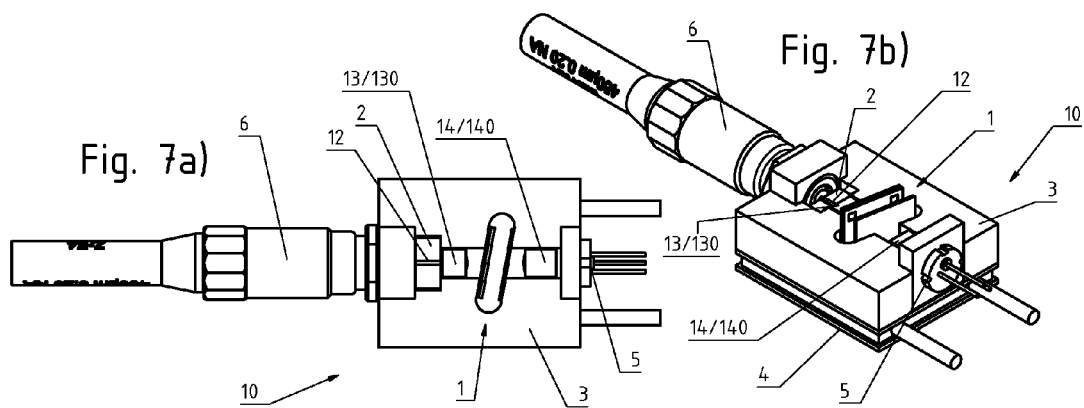
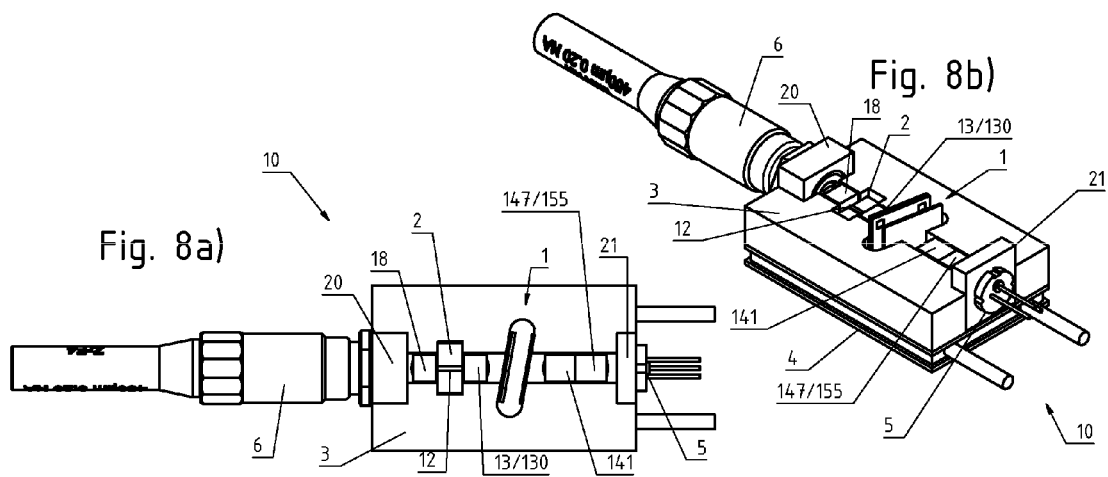

MID-IR EXTERNAL CAVITY QUANTUM CASCADE LASER WITH A WAVELENGTH-ADJUSTABLE INTERFERENCE FILTER

CROSS-REFERENCE TO RELATED APPLICATIONS

This is the U.S. National Stage of International Patent Application No. PCT/EP2019/055037 filed on Feb. 28, 2019, which claims priority to European Patent Application No. 18159180.1 filed on Feb. 28, 2018.

The invention relates to a wavelength-adjustable laser comprising a wavelength-adjustable filter. Furthermore the invention relates to a method for filtering out-of-band laser modes with a laser according to the invention.

Ever since its first experimental demonstration in 1994 [1] the Quantum Cascade Laser (QCL) has been the main candidate to aspire to similar technological significance in the mid-infrared (MIR) region as the inter-band diode laser has in the visible (VIS) and near-infrared (NIR) ranges [2]. While the VIS and NIR provide the most suitable ranges for telecommunication and illumination, the MIR contains both, the infrared atmospheric window and the so-called fingerprint region of many molecules [3], promising ultra-sensitive yet affordable MIR spectroscopy—e.g. for biomarker detection of various health conditions.

Fixed-wavelength QCLs are known in the state of the art, such as for example distributed feedback (DFB) QCLs [4]. For most complex tasks, like spectroscopy of biological matter—wavelength tuning is required. Despite other designs and concepts being pursued, external cavity (EC)-QCLs currently provide the most promising option to perform broad-range spectroscopic measurements.

The most common EC-QCLs use a diffraction grating as a wavelength-selective element, as for example Littrow and Littman-Metcalf configurations that renders the resonator extremely sensitive to mechanical perturbation [5] with large round-trip coupling losses to and from the laser chip.

One reason is the extreme difference in lateral dimensions between the exit facet of the QCL at several micrometres and the illuminated area on the grating at several millimetres. The required beam expansion imposes extremely narrow tolerances on the alignment of the collimating optics.

Furthermore, due to the diffraction gratings' comparably small angular dispersion, diffraction gratings require a very rigid and accurately controllable mount to decrease mechanical vibrations around the tuning axis.

Moreover, due to constructional constraints in the diffraction grating based designs, out-coupling of laser light often happens at oblique angles, resulting in beam walk-off and pointing-related problems. This is particularly problematic when real-time monitoring of beam properties (power/wavelength) is desired, requiring a second emission port or an off-axis beam splitter.

For these reasons, applications of current EC-QCLS are mainly bound to a protected laboratory environment. Only few manufacturers produce portable devices [6] by employing ultra-stiff structures that are therefore bulky and costly and that do not have much potential for cost-reduction due to the complex opto-mechanics.

Non-grating-tuned EC-QCL designs include Vernier-tuned filter chip versions (Block Engineering, U.S. Pat. No. 8,908,723), Vernier-tuned double etalon thermo-electric versions (Redshift Systems, EP2700132), and an angle-tuned narrow-filter EC-QCL (EP2848968).

All these designs have several technical challenges resulting in high costs per unit (even when produced in high volume) and low lifetime.

The angle-tuned narrow filter EC-QCL comprises a Fabry-Perot filter configuration, however makes no use of its potential for miniaturization, cost reduction, and stabilization, since precise opto-mechanics (stepper-motors, galvanometers) that are able to tilt the Fabry-Perot filter by several tens of degrees are again necessarily large and bulky.

Widely angle-tuneable filters selecting a narrow wavelength band are very costly to produce, as low refractive index materials are comparably expensive but necessary for sufficient angle-tunability.

Other approaches, such as the use of a micro-machined and micro-actuated Fabry-Perot filter, such as a MEMS (micro-electro-mechanical system) Fabry-Perot filter, for tuning the emission wavelength of a MIR semiconductor laser by adjusting the cavity length of the Fabry-Perot filter have not been attempted in the art, as there are several factors that are deemed inhibitive for its use.

For example, a typical EC-QCL for laser emission around 9 μm with a chip-length of 4 mm and a total external cavity optical length of 30 mm has a mode-spacing of approximately 0.17 $cm^{-1}$, (1.5 nm). Reasonable mode discrimination therefore requires a filter having a bandwidth in the range of the EC-QCL mode spacing.

The best available MEMS-Fabry-Perot filters for transmission around 9 μm, achieve a bandwidth of 12 $cm^{-1}$ (100 nm). Such MEMS-Fabry-Perot filters therefore contain over 50 laser modes and highly unstable mode fluctuations are expected in an EC-QCL, especially when driven in pulse current mode.

Furthermore, due to the non-ideal parallelism between the filter mirrors of a MEMS-Fabry-Perot filter, which even varies dynamically during operation, the transmitted beam tends to walk off the optical axis. Since QCL facets are only several microns in diameter, such a beam walk-off would impair, if not terminate laser operation, as the QCL facet-coupling efficiency of a resonating laser beam would be diminished by such a beam displacement.

Thus, although EC-QCLs are known for many years, they remain comparably bulky and complex devices, in order to be able to provide optically and mechanically stable laser operation.

Accordingly, the objective of the current invention is to provide a device that solves these problems.

The problem according to the invention is solved by a laser according to a method according for filtering out-of-band laser modes of a laser according to the invention.

Accordingly, a wavelength-switchable semiconductor laser, particularly for generating laser light comprising a wavelength in the range between 1 pm and 40 pm or 100 pm, with an external cavity comprises at least the following components:
  a semiconductor optical amplifier (SOA), particularly being part of the external cavity, comprising an intra-cavity facet facing towards
  a first, particularly refracting or reflecting, optical element for collimating a laser beam exiting the intra-cavity facet arranged at the intra-cavity facet of the semiconductor optical amplifier,
  a transmissive, wavelength-adjustable interference filter (IF), comprising at least
    i. a wavelength-adjustable Fabry-Perot filter (FPF) and
    ii. a Fabry-Perot etalon (FPE) comprising a first planar surface and a second planar surface, wherein the first and second surface of the etalon are arranged opposite and plane-parallel to each other and delimit an etalon cavity, wherein the Fabry-Perot etalon and the Fabry-Perot filter are arranged in a row, wherein the interference filter (IF) is arranged between the first optical element and the beam splitter, and wherein the components are arranged such that laser light comprising a selected laser wavelength can stably resonate in the external cavity, wherein an on-axis, retro-reflecting beam splitter is arranged at one end of the external cavity.

The on-axis, retro-reflecting beam splitter can serve as an end mirror or an output coupler of the external cavity.

The Fabry-Perot etalon, also referred as "etalon" only in this specification is particularly also a Fabry-Perot filter, particularly with a fixed cavity length.

The interference filter (IF) therefore particularly comprises a (first) Fabry-Perot filter (FPF) and a (second) Fabry-Perot filter (FPE or etalon). In some embodiments of the invention, the cavity length of the Fabry-Perot filter is adjustable and variable while the cavity length of the etalon is fixed. Furthermore, according to some embodiments of the invention, a free spectral range and a transmission bandwidth of the Fabry-Perot filter is greater than a free spectral range and a transmission bandwidth of the etalon and the transmission bandwidth of the Fabry-Perot filter is of similar magnitude as the free spectral range of the etalon. The wavelength transmitted by the interference filter particularly lies within a low order transmission band of the Fabry-Perot filter, e.g. the first, second, or third order band, and lies within a higher order band of the etalon, e.g. higher than the fifth or tenths.

The term "wavelength-switching" specifically refers to aligning the low order transmission band centre wavelength of the Fabry-Perot filter with different higher order transmission bands of the etalon.

A laser with these features advantageously solves the problem of providing robust and wavelength-tuneable, single-mode laser operation using a compact external cavity laser with a robust and compact transmission interference filter.

For this purpose, the laser components can be arranged as follows: The semiconductor optical amplifier (SOA), the first optical element, the wavelength-selectable interference filter and the retro-reflecting beam splitter are arranged such in the laser that a laser beam emerging from the intra-cavity facet of the SOA comprising a selectable laser wavelength can pass from the intra-cavity facet through the first optical element and the interference filter to the retro-reflecting beam splitter and pass back to re-enter the intra-cavity facet into the semiconductor optical.

The Fabry-Perot filter can comprise a first surface and a second surface that are arranged opposite and plane-parallel to each other and delimit an Fabry-Perot filter cavity. These surfaces can be comprised in mirror elements of the Fabry-Perot filter.

The first and second surfaces of the Fabry-Perot filter are particularly planar and particularly optically flat, wherein the first and second surface of the Fabry-Perot filter are arranged opposite and plane-parallel to each other and form an optical Fabry-Perot cavity of the Fabry-Perot filter extending along the surface normals of the first and second surface of the Fabry-Perot filter.

The first and second surfaces of the etalon are planar and particularly optically flat, wherein the first and second surface of the etalon are arranged opposite and plane-parallel to each other and form a Fabry-Perot cavity of the etalon extending along the surface normals of the first and second surface of the etalon.

The etalon and the Fabry-Perot filter cavities particularly serve to reflect the laser light back and forth to achieve isolated transmission passbands through multi-beam interference as is well-known in the art.

The etalon and the Fabry-Perot filter are particularly arranged in front of each other, such that a particularly collimated light beam, particularly comprising the selected laser wavelength, passes through the etalon and the Fabry-Perot filter.

The interference filter (IF) particularly is the combination of the etalon and the Fabry-Perot filter and is also referred to as "wavelength-selectable interference filter" in the following.

An external cavity in this context refers to the feature of the laser that the resonator is located at least partially outside the semiconductor optical amplifier (SOA), also referred to as the semiconductor chip or active region. The SOA has commonly two facets, where light can exit the SOA. One facet, the intra-cavity facet, faces inwards the external cavity of the laser and the other facet, the extra-cavity facet, faces outwards the resonator.

The intra-cavity facet is particularly coated with an anti-reflection (AR)-coating.

End mirrors usually have a high reflectance, for example in the range above 99%, wherein output couplers have a reduced reflectivity—typically in the range of 5% to 90%. The functionality though remains the same; the end mirror or output coupler back-reflects at least a fraction of the resonating laser light into the cavity, such that the light amplification process is maintained and the cavity is closed.

The wavelength-switchable laser according to the invention can be built very compact and small and particularly comprises only one moving component, namely the first actuating device of the Fabry-Perot filter. And even in the actuating device, the movement is reduced to particularly electrostatic micro-positioning with displacements for example in the range of 0.5 μm to 10 μm.

Compared to other wavelength-switchable lasers that particularly emit in the MIR range, the laser according to the invention can be manufactured comparably cost-effectively, as all components can be manufactured in conventional micro-machining processes such as photolithographic processes and deep reactive ion (DRIE) etching.

Along with the now possible miniaturization of the laser, and the low beam expansion of the collimating intra-cavity optics, i.e. particularly the first optical element, as compared to grating based lasers, the stability of the laser is increased to a point, where misalignment of the setup is nearly impossible without physically damaging the structure. This also allows the use of much lighter and cheaper materials for the mechanical components, such as various types of plastic polymers.

Regarding the intra cavity beam expansion, it is noted that beam expansions to particularly less than 10λ are trivially possible using the invention resulting in reduced coupling loss and better beam quality due to only small beam expansion of the collimating optics.

The wavelength-selectable interference filter components (FPF and etalon) are particularly arranged at an angle with respect to the resonating laser beam in the external cavity, such that out-of-band laser light is reflected out of the beam path. The term "out-of-band" refers to light with wavelength outside the narrow transmission band of the wavelength-selectable interference filter. The width of the transmission band of the interference filter is almost identical to the width of each transmission band of the etalon and substantially smaller than the width of the transmission band of the Fabry-Perot.

One advantage of the retro-reflecting beam splitter is that the beam walk-off by non-parallel mirror elements (as perfectly parallel reflective layers cannot be achieved) of the particularly MEMS-Fabry-Perot filter is countered by using said, particularly passively, self-aligning retro-reflecting beam splitter, while simultaneously providing a second output port of the laser, e.g. for monitoring purposes.

The integration of an etalon in the external cavity to facilitate the use of Fabry-Perot filters, particularly MEMS-FPFs with broad transmission band in a laser is novel to the state of the art. It is furthermore novel that the etalon is arranged such in the laser that it can be used as a frequency normal as well as to monitor the beam properties.

Also, the self-aligning nature of the retro-reflecting, on-axis beam splitter removes the general mechanical instabilities of grating- and mirror-terminated external cavities known in the state of the art.

The mechanical stability increase that comes with the retro-reflecting beam splitter can be derived from the following formulas. It can be shown that the change in feedback FB from any reflector, such as a curved mirror or a retro-reflecting beam splitter back into the SOA facet has the form $$\frac{d^2 FB}{d\alpha^2} = -2\pi^2 \frac{w^2}{\lambda^2}$$

for angular misalignment of the reflector and $$\frac{d^2 FB}{d\delta^2} = -\frac{2\lambda^2}{\pi^2 w^4}$$

for longitudinal misalignment of the reflector. In the above formulas, $\alpha$ is the angular misalignment, $\delta$ is the longitudinal misalignment, $\lambda$ is the center wavelength of the laser and w is the spot size of the beam on the reflective surface of the reflector (in case of a retro-reflecting beam splitter in form of a cat's eye this is the rear surface).

$$\frac{d^2}{d\ldots^2}$$

is the second order differential operator. For a typical semiconductor laser external cavity with a planar or a curved mirror, the spot size w is in the order of a millimeter, resulting in 20% feedback loss (at $\lambda$=10 μm wavelength) for $\alpha$=1 mrad=0.06° for $\delta$=100 mm. For a cat's eye the trade-off between angular $\alpha$ and longitudinal $\delta$ displacement is favorably shifted towards the angular displacement $\alpha$: With a typical focused spot size of w=10 μm this is $\alpha$=100 mrad=6° and $\delta$=10 μm. Since angular misalignment of 6° is an unrealistically high value to achieve without physically damaging the external cavity's integrity and the retro-reflecting beam splitter, particularly the cat's eye, it can be said that the retro-reflecting beam splitter setup is fully stable to misalignment if the laser structure is not to be physically damaged.

It is noted that the retro-reflecting beam splitter serves a fundamentally different purpose as compared to the use of curved mirrors used in laser resonators in the state of the art. The theory of the use of curved mirrors and their relation to the resonator length to yield "optical stability criteria" of a resonator are well known in the art. However, these well-known optical stability criteria need modification to result in mechanical stability criteria, which also have to account for the finite dimensions of the active medium e.g. the SOA. This holds particularly true, when the dimensions of the SOA facet are far smaller than the radius of curvature of the mirrors, as is the case for semiconductor lasers in external cavities (micrometer facet diameters vs. millimeter radii of curvature). In this case, a curved mirror only serves to compensate for the curved wave front of a non-collimated Gaussian beam, thereby increasing the collection angle of said non-collimated beam. Slight angular misalignment of the curved mirror (around a pivot point lying on the mirror surface) therefore directly displaces the reflected beam like a plane mirror displaces a collimated beam, thereby reducing feedback into the SOA facet.

Consequently, use of a curved mirror does not, to first order, increase the mechanical stability of a semiconductor external cavity. For small SOA facets, a curved mirror is only stable towards angular misalignment around its own focal point. Therefore, only small correction for realistic pivot points can be achieved.

Since there are two available on-axis output ports—one at the extra-cavity facet of the SOA and the other at the retro-reflecting beam splitter, on either end of the external cavity with well-defined and invariant beam properties, one of these beams can be used to monitor the laser performance in real time, as the emission power of the two output ports will be in a fixed ratio.

As both on-axis output ports emit light from a well-defined focal point, the light can easily be coupled to infrared optical fibres.

On-axis beam access to both output ports for monitoring purposes without the use of an off-axis beam splitter that necessarily introduces losses, and makes the setup larger and unstable, is another advantageous feature of the laser according to the invention.

Since the etalon particularly also functions as a frequency normal in the laser, the laser can be tuned to a selected laser wavelength by counting the output power peaks of the laser as the Fabry-Perot filter is tuned. The output laser wavelength can be therefore selected with great confidence.

Furthermore, the laser can achieve very narrow spectral line-width even in pulsed-mode and very high wavelength accuracy and repeatability by combining the SOA and the wavelength-selectable interference filter. This is particularly due to the emission laser wavelength being confined to the transmission width of the etalon. Typically, even in single-mode emission, there is a wavelength chirp due to heating of the SOA within the pulse and corresponding change of the refractive index and effective optical cavity length. In a laser according to the invention, if the chirp exceeds the width of the etalon transmission peak, the laser is particularly forced to hop to a mode within the transmission, thus effectively reducing the time-averaged linewidth.

By simply maximizing the output power of the laser, the Fabry-Perot filter transmission will be centered on an etalon mode and thus a well-defined laser wavelength; a task that can be performed closed-loop.

Therefore, the laser according to the invention facilitates closed-loop simultaneous power and wavelength control using only one monitoring detector.

The inter-device reproducibility of the emitted wavelengths for different lasers of the same kind can be achieved by adjusting the tilt angle of the etalon with respect to the optical axis of the external cavity.

According to another embodiment of the invention, the wavelength-adjustable Fabry-Perot filter comprises particularly the following components:
a) a first mirror element, comprising a first reflective, planar, particularly optically flat layer,
b) a second mirror element, comprising a second reflective, planar, particularly optically flat layer,
c) an actuation device, wherein the first mirror element and/or the second mirror element are arranged such on the actuation device, that the first reflective layer of the first mirror element and the second reflective layer of the second mirror element are arranged opposite and plane-parallel and face-to-face to each other, such that the first and second layer form a gas-filled or an evacuated cavity extending along the surface normal of the first and second layer, wherein the actuation device is configured to move the first mirror element relative to the second mirror element along the surface normal of the first and second layer.

According to an embodiment of the invention, an optical distance between the first and second surface of the etalon is at least as large as the optical distance between the first and second layer of the Fabry-Perot filter, i.e. the Fabry-Perot filter cavity length, divided by a relative tuning range of the Fabry-Perot filter and at most as large as the Fabry-Perot filter cavity length times its finesse. This particularly ensures that the Fabry-Perot filter can select one of at least two etalon transmission bands with sufficient rejection of the other.

The optical distance is particularly the optical path length particularly given by the geometric distances times the refractive index of said path.

The etalon cavity length is particularly identical to the optical distance of the first and second surface of the etalon. The Fabry-Perot filter cavity length is particularly identical to the optical distance of the first and second surface of the Fabry-Perot filter.

The wavelength selected by the Fabry-Perot filter is particularly defined as the central wavelength of the transmission band of the Fabry-Perot filter in the transmission order that lies within the wavelength range where the SOA emits stimulated emission (gain spectrum). The wavelength can be selected by the Fabry-Perot filter by adjusting the cavity length of the Fabry-Perot filter.

The absolute tuning range of the Fabry-Perot filter is particularly defined as the difference between the largest and the smallest wavelength that can be selected by the Fabry-Perot filter, i.e. the limiting wavelengths of the Fabry-Perot filter.

The limiting wavelengths selected by the Fabry-Perot filter are particularly defined by the minimum and maximum Fabry-Perot cavity lengths as determined by the travel distance of the actuation device.

The "central wavelength of the Fabry-Perot filter" is particularly defined as the arithmetic mean of the limiting wavelengths.

The relative tuning range of the Fabry-Perot filter is particularly the absolute tuning range of the Fabry-Perot filter divided by the central wavelength. A relative tuning range of e.g. 20% comprises all wavelengths that are up to 10% smaller or larger than the central wavelength.

For example, if the Fabry-Perot filter has a relative tuning range of 20% around the central wavelength, then the lower boundary for the (optical) etalon cavity length is five times the Fabry-Perot filter cavity length and the upper boundary for the (optical) etalon cavity length is the Fabry-Perot filter cavity length times the finesse of the Fabry-Perot filter cavity. This particularly ensures that a etalon transmission comb is such that there are at least two transmission peaks in the Fabry-Perot filter's tuning range and that said transmission peaks are spaced no closer than half the peak width of the Fabry-Perot filter (otherwise the Fabry-Perot filter could not discriminate between them).

Note that the etalon and the Fabry-Perot filter might enclose an angle with respect to each other.

The combination of the wavelength-selectable interference filter components, namely the Fabry-Perot filter and the etalon, particularly with the specific differences in cavity lengths, allows for the wavelength-adjustable filtering of light and achieves a comparably small bandwidth for a selected laser wavelength.

The etalon is also referred to as a mode spreader or frequency normal. Light in the context of the specification refers to electromagnetic waves, particularly in the near-, mid- and/or far infrared wavelength range, more particularly in the terahertz region of the electromagnetic spectrum. Thus, the light is not necessary visible to the human eye.

The infrared spectrum particularly ranges between the vacuum wavelengths $10^{-3}$ m und $7.8 \times 10^{-7}$ m (1 mm and 780 nm), which corresponds to a frequency range of $3 \times 10^{11}$ Hz to approximately $4 \times 10^{14}$ Hz (300 GHz to 400 THz).

The near-infrared (NIR) region particularly ranges from 0.78 μm to 3 μm.

The mid-infrared (MIR) region particularly ranges from 3 μm to 50 μm.

The far-infrared (FIR) region particularly ranges from 50 μm to 1000 μm.

The two interference filter components, the Fabry-Perot filter and the etalon, while effectively filtering based on interference, have particularly different filter characteristics, such as the transmission band width and the free spectral range (FSR), as particularly their cavity lengths are different.

The transmission peak width and the free spectral range of the respective filter component are—inter alia—defined by the cavity length of the respective filter component.

However, also other factors do influence the above mentioned filter characteristics, such as the reflectivity of the surfaces of the Fabry-Perot filter and of the etalon.

As the actuation device is configured to move the first and/or second mirror element, the first and second layer can be brought closer together or farther away from each other. The actuation device is therefore configured to adopt at least two different positions, the first and the second position. The actuation device can be configured to adopt a plurality of positions, particularly a continuous plurality of positions, such that particularly a continuous plurality of cavity lengths of the Fabry-Perot filter can be achieved. The cavity length of the Fabry-Perot filter is filled with a gas, particularly with air, or it is evacuated.

The Fabry-Perot filter cavity length corresponds particularly to the distance between the first reflective layer of the first mirror element and the second reflective layer of the second mirror element.

The term "reflective" refers to the property of the respective component of being reflective at least within a wavelength range that particularly comprises the selected laser wavelength, i.e. the wavelength that is selected for transmission.

Furthermore, within this specification and the claims, it can be distinguished between reflections that are caused by light passing from a material having a refractive index to a material having a different refractive index. This reflection is referred to as Fresnel-reflection. Fresnel-reflection happens for example on all surface-air or surface vacuum interfaces of the components, when light exits or enters a component. Even when not explicitly stated, such a surface is considered to be reflective.

On the other hand, reflection can be achieved based on the property of the material itself. For example, the reflection can be increased by dedicated reflection-enhancing thin-film coating structures. Enhanced surface reflectivity can be also achieved by so-called Distributed Bragg Reflectors (DBRs), comprising one or multiple pairs of thin films of high refractive index and low refractive index materials that are transparent in the desired wavelength range with appropriate thicknesses and stacking order.

Alternatively also or sub-wavelength-structured gratings can be used for enhancing the reflectivity of a surface.

In contrast to reflection-enhancing coatings or structures, anti-reflection (AR) coatings are particularly designed to reduce Fresnel-reflection. AR-coatings are also referred to as reflection-reducing coatings. Surfaces with an AR-coating exhibit a reflectivity lower than particularly 5%, more particularly lower than 4%.

Thus, the surfaces of the etalon do particularly not have AR-coatings, as such coatings would compromise the function of the etalon.

The term "reflectivity-altering" refers to a layer or structure arranged on the surface that either increase or reduces the reflectivity of the surface.

The term "transparent" (as well as the term "reflective") is to be understood in relation to the selected laser wavelength, i.e. "transparent" refers to the property of being transparent in the respective spectral region. Thus, the term "transparent" particularly does not refer to the visible region of the electro-magnetic spectrum, but particularly to the near-, mid- to far-infrared and even up the Terahertz region.

The term "optically flat" refers to the property of the material comprising an optical flatness of $\lambda/4$ or better, wherein $\lambda$ is the selected laser wavelength.

The term "high-numerical aperture" refers to numerical apertures of optical elements, such as lenses, that are greater than 0.5, particularly greater or equal to 0.7. The numerical aperture is particularly the Sinus of the half-angle of the cone formed by the open aperture of the optical element and its focal point on the optical axis, multiplied with the index of refraction of the ambient medium, n=1 for air or vacuum. Thus the numerical aperture is a measure for the collection efficiency of a lens for light emitted by a point-like source with high beam divergence in the focal point.

The first and second reflective layers of the Fabry-Perot filter can consist of or comprise a layer structure.

The first and second reflective layers of the Fabry-Perot filter are or comprise a reflection-enhancing coating. The mirror elements particularly comprise a transparent, particularly optically flat substrate on which said reflective layer is arranged. The layer can be coated onto the substrate using well-known photolithographic techniques, thin film-deposition, and wafer-bonding.

The substrate of the first and/or the second mirror element extend particularly more than 0.1 mm along the surface normal the respective reflective layer, particularly for providing and assuring the required optical flatness for the reflective layer despite coating-induced stresses.

The substrate of the first and/or the second mirror element can comprise an AR-coating on the opposite surface of the reflective layer.

The wavelength-selectable interference filter according to the invention is operated in transmission configuration that is the incident light is filtered when passing through the wavelength-selectable interference filter. Therefore, in contrast to reflective filters, such as reflective diffraction gratings, the wavelength-selectable interference filter according to the invention is a transmissive filter.

The wavelength-selectable interference filter according to the invention allows for a digital tuning of the laser wavelength. The term "digital" refers to the fact that the wavelength-selectable interference filter can be adjusted to provide the laser wavelength comprised by a set of discrete, non-continuous wavelengths.

The spacing, i.e. the free spectral range, between the wavelengths comprised in said set, can be comparably narrow, so that the wavelength-switchable laser is suitable for many applications such as spectroscopy.

Furthermore, as will be addressed in several embodiments, it is possible to adjust the laser wavelength to any wavelength between the discrete wavelengths, by essentially shifting the set of discrete wavelength by an offset wavelength, so that essentially continuous tuning of the wavelength-selectable interference filter is achieved.

The etalon is particularly a Fabry-Perot interferometer, comprising two surfaces that are reflective at least due to Fresnel-reflection. As the Fabry-Perot filter, also the etalon provides optical filtering based on interference.

According to an embodiment of the invention, the etalon cavity comprises or consists of a transparent, particularly optically flat, solid substrate, wherein the first and the second surface of the etalon are comprised by the substrate or wherein the first and/or the second surface of the etalon are a reflective layer on the substrate.

It might be advantageous to provide a protection layer on top of reflective layer of the etalon. This protection layer might not be regarded as the surface of the etalon. Despite the reflective layer not being the outmost layer on the etalon.

The surfaces of the etalon particularly exhibit Fresnel-reflection.

The advantage of this embodiment is that the etalon is a robust, particularly non-moving part of the wavelength-selectable interference filter. The optical distance between the etalon substrate surfaces, i.e. the optical thickness of the etalon substrate, corresponds to the etalon cavity length, while the substrate is the etalon cavity. The optical distance corresponds to the optical path, i.e. particularly the physical distance that is traversed by a light ray multiplied by the refractive index of the medium.

Aside from thermal expansion, the etalon cavity length is fixed and thus the wavelength-selectable interference filter characteristic is robust with respect to a de-tuning of the Fabry-Perot filter.

Additionally wavelength tuning and/or stabilization of the etalon can be achieved by adjusting or controlling the etalon temperature.

According to another embodiment of the invention, the substrate of the etalon is transparent in the mid-infrared spectrum, particularly in the wavelength region of 3 µm to 20 µm, more particularly between 9 µm and 12 µm, particularly comprising or consisting of silicon, germanium, ZnSe, GaAs, InP, or chalcogenide glass.

This embodiment allows for a cost effective implementation of an etalon for the mid-infrared range.

According to an alternative embodiment of the invention, the etalon cavity is gas-filled, particularly air-filled, or evacuated and the etalon cavity length between the first and second surface of the etalon is adjustable, particularly by a second actuation device.

According to this embodiment, the etalon is mechanically tuneable to a laser wavelength. This allows for continuous wavelength tuning of the wavelength-selectable interference filter. The tuneable etalon can be considered as a second Fabry-Perot filter.

Furthermore, the second actuation device can be of the same kind, identical or similar to the first actuation device.

According to another embodiment of the invention, the etalon cavity has a length of less than 5 mm, particularly less than 1 mm, particularly less than 0.4 mm more particularly less than 0.1 mm.

These cavity lengths allow for a comparably narrow transmission peak width of the etalon, providing a narrow transmission peak to the wavelength-selectable interference filter.

According to another embodiment of the invention, the etalon and the Fabry-Perot filter are arranged such that for an incident light beam, comprising the selected laser wavelength, particularly between 3 μm and 20 μm, more particularly between 8 μm and 12 μm, the free spectral range of the etalon is at least 5 times smaller, particularly at least 10 times smaller, more particularly at least 100 times smaller, than the free spectral range of the Fabry-Perot filter, and wherein the full-width half-maximum of the transmission band of the selected laser wavelength of the etalon is at least 5 times smaller, particularly 10 times smaller, more particularly 100 times smaller, than the full-width half-maximum of the transmission band of the Fabry-Perot filter.

According to another embodiment of the invention, the Fabry-Perot filter has a Finesse greater than 50, particularly greater than 70, more particularly greater than 100.

While the free spectral range FSR or $\Delta\lambda$, i.e. the spacing between transmission peaks of a Fabry-Perot interferometer (for the Fabry-Perot filter and the etalon), is defined as $$\Delta\lambda = \frac{\lambda_0^2}{2n \cdot l \cdot \cos(\theta) + \lambda_0}$$

the width of the transmission peaks $\delta\lambda$ is related to the free spectral range $\Delta\lambda$ by the so-called Finesse F:

$$F = \frac{\Delta\lambda}{\delta\lambda}$$

where $\lambda_0$ is the central wavelength of the nearest transmission peak, n is the refractive index and ι the cavity length.

This embodiment limits the etalon properties to a range that in combination with a Fabry-Perot filter, allows for an advantageous interference filter in comparison to conventional interference filters.

According to another embodiment of the invention, the Fabry-Perot filter has a peak transmission greater than 55%, particularly greater than 70%, more particularly greater than 85%.

This embodiment makes up a filter with particularly good transmission properties.

According to another embodiment of the invention, each of the surfaces of the etalon and the reflective surfaces of the Fabry-Perot filter are parallel to each other.

Parallel in this context refers to the unfolded light path between the Fabry-Perot filter and the etalon, thus a folding mirror between the Fabry-Perot filter and the etalon is not considered to render the surfaces non-parallel, as the unfolded light path would render the surfaces parallel.

According to another embodiment of the invention, the etalon is particularly integrally comprised by the first mirror element of the Fabry-Perot filter, wherein the first mirror element comprises the transparent substrate of the etalon and wherein the first surface of the etalon is the reflective layer of the first mirror element.

This embodiment is particularly advantageous, as it allows for a more compact integration of the wavelength-selectable interference filter.

As the etalon is comprised by the first mirror element, the wavelength-selectable interference filter comprises less separate elements. This results in a more stable interference filter.

In an analogous manner, the etalon can alternatively be comprised by the second mirror element.

According to another embodiment of the invention, the first mirror element comprises a second surface, particularly facing away from the Fabry-Perot filter cavity, wherein the second surface of the first mirror element is the second surface of the etalon, wherein said second surface is particularly not AR-coated, wherein said second surface is particularly coated with a reflection-enhancing layer or a reflection enhancing structure.

Such a filter has less separate elements, and is thus more stable.

In an analogous manner, this embodiment can be realized alternatively in the second mirror element as well.

Particularly when the first and second surfaces of the etalon are comprised in the first mirror element, it is possible to alternatively formulate said embodiment as follows.

According to another embodiment of the invention, the first reflective layer of the first mirror element is the first or second reflective layer surface of the etalon substrate.

According to an alternative embodiment of the invention, the etalon and the Fabry-Perot filter are two disjoint components of the wavelength-selectable interference filter.

This modular embodiment is advantageous as for example the Fabry-Perot filter can be oriented separately from the etalon. It is particularly possible to tilt the etalon in a different angle than the Fabry-Perot filter, which allows for more precise calibration or tuning of the wavelength-selectable interference filter.

According to another embodiment of the invention, the first actuating device of the Fabry-Perot filter comprises a micro-electro-mechanical system (MEMS), wherein the first and/or the second mirror element are arranged on the micro-electro-mechanical system such as to alter the distance between them.

This embodiment is particularly advantageous as the fabrication of MEMS-Fabry-Perot filters is a comparably cost effective process. Thus, an interference filter incorporating a MEMS-Fabry-Perot filter is not as expensive as for example other tuneable grating-based filters.

MEMS devices are well controllable and stable. Thus, the MEMS-Fabry-Perot filter can be tuned precisely, i.e. the distance between the first and second reflective layer can be adjusted with high precision, particularly better than 50 nm.

Furthermore, MEMS-Fabry-Perot filters are smaller than grating-based filters and therefore the whole filter can be built smaller. MEMS are also very robust.

According to another embodiment of the invention, the second actuating device of the etalon comprises a micro-electro-mechanical system (MEMS), wherein the first and/or the second surface of the etalon are arranged on the micro-electro-mechanical system such as to alter the distance between them.

According to another embodiment of the invention, the first and/or second actuation device comprises an electro-statically micro-actuating, particularly micro-machined actuator. Such an actuator is for example a MEMS, wherein said actuator is actuating the mirror element(s) or the surface(s) of the Fabry-Perot filter or the etalon based on electrical fields that can be applied to the MEMS.

According to another embodiment of the invention, the first and/or second actuation device comprises a plurality of individually operable pairs of actuation electrodes to control the orientation of the reflective surfaces of the Fabry-Perot filter and/or the orientation of the surfaces of the etalon.

This is particularly advantageous, as the relative orientation of the surfaces of the etalon and the relative orientation of the reflective layers of the Fabry-Perot filter should be controlled very precisely, as this determines the quality of the wavelength-selectable interference filter.

With pairs of actuating electrodes this task is achieved.

According to another embodiment of the invention, the Fabry-Perot filter has particularly separate electrodes on the first and/or the second mirror element to adjust the x- and y-distances of the reflective layers to allow for tilt compensation. This can be facilitated by a closed-loop tilt compensation using a capacitive distance measurement and active electronic distance adjustment.

According to another embodiment of the invention, the first and/or second actuation device comprises a magnetically-actuating, particularly micro-machined actuator.

Also actuators whose actuation is based on induced magnetic fields might provide actuation suitable for the wavelength-selectable interference filter.

According to another embodiment of the invention, the first actuation device is configured such that either the first mirror element is movable with respect to the particularly fixed second mirror element or the second mirror element is movable with respect to the particularly fixed first mirror element, or wherein the first and second mirror element are movable, wherein the first and second mirror element particularly have identical mass and suspension.

The latter feature of the similar or identical mass is useful to compensate for external accelerations and forces such as gravity.

The term "moveable" in this context refers to the translational movement of the mirror elements in order to alter the distance between the reflective layers. However, also movements that are of rotational nature, such as for adjusting the relative orientation of the first and second reflective layer for obtaining and maintaining a parallel layer configuration, are included in this notion.

According to another embodiment of the invention, the second actuation device is configured such that either the first surface of the etalon is movable with respect to the particularly fixed second surface or the second surface is movable with respect to the particularly fixed first surface of the etalon, or wherein the first and second surfaces are movable, wherein the first and second surface particularly have identical mass and suspension particularly in order to compensate for external accelerations and forces such as gravity.

This embodiment is to be understood in the context of a gas-filled or evacuated etalon cavity only.

The advantage of this embodiment is that the adjustment of the distance between the surfaces can be achieved in various ways such that for each application a fitting embodiment can be found. The same applies for the embodiment where the mirror elements are moveable in various manners, as disclosed in a previous embodiment.

According to another embodiment of the invention, the first optical element is arranged such at the intra-cavity facet that it collimates a laser beam exiting the intra-cavity facet.

According to another embodiment of the invention, the laser comprises a means for temperature stabilization, particularly a heating or cooling element, wherein said means is arranged such in the laser that the etalon can be temperature stabilized.

The laser according to the invention allows the use of all-semiconductor micro-machined components with near-arbitrary miniaturization along with very high mechanical and spectral stability and very low unintentional resonator loss (i.e. high external cavity coupling).

Furthermore, the laser according to the invention benefits from the following synergy effects. The beam splitter used for stability and coupling efficiency is configured for use in combination with a transmissive interference filter. The transmissive interference filter provides the best performance when combined with the increased coupling from the beam splitter (since unavoidable on-line filter losses for example due to scattering and absorption are doubled as there are two passes).

According to another embodiment of the invention, the beam splitter is a cat's eye retro-reflector, comprising a refracting optical element with a reflective surface and a focal surface, wherein the refracting optical element is configured such that the focal surface of the refractive element coincides at least partially, particularly on the optical axis, with the reflective surface.

A cat's eye beam splitter provides all the features of the self-aligning passive retro-reflecting beam splitter, while exhibiting only low constructional complexity. The cat's eye beam splitter can be a monolithic device.

The output port of the laser on the side of the beam splitter provides a well-defined focal point for easy handling of the emitted laser light. For example, it is possible to couple the emitted light to a fibre, particularly without additional components, except a fibre coupling device.

The reflective surface of the retro-reflective beam splitter exhibits a reflectivity of particularly less than 100%, more particularly less than 95%, more particularly less than 80%, more particularly more than 20%, as one of the output ports lies on the side of the reflective surface.

According to another embodiment of the invention, the first optical element is a thick high-numerical aperture, particularly larger than 0.5, collimating lens, wherein the lens is particularly an aspheric, plano-convex lens, wherein the lens particularly has an open aperture of less than or equal to 2 mm.

According to another embodiment of the invention, the SOA is a Quantum Cascade Laser (QCL).

According to another embodiment of the invention, the SOA is an (Interband) Diode Laser.

According to another embodiment of the invention, the SOA is a Quantum Well Laser.

According to another embodiment of the invention, the SOA is an Interband Cascade Laser.

According to another embodiment of the invention, the SOA is a Quantum Dot Laser.

According to another embodiment of the invention, the SOA is a Vertical Cavity Surface Emitting Laser (VCSEL).

According to another embodiment of the invention, the laser is configured to emit in the NIR range.

According to another embodiment of the invention, the laser is configured to emit in the MIR range.

According to another embodiment of the invention, the laser is configured to emit in the FIR range.

According to another embodiment of the invention, the laser is configured to emit in the THz range.

The laser according to the invention performs particularly well in the MIR, if the SOA is a QCL.

The QCL has an output facet facing the beam splitter (intra-cavity facet), wherein said facet is particularly coated with a reflection-reducing coating structure. The other facet (extra-cavity facet) of the QCL can have a reflection-altering coating, particularly a coating that leaves the extra-cavity facet partially reflective, particularly in the range of 20% to 70%, and even up to 100%.

According to another embodiment of the invention, the laser is configured for pulsed-mode operation. This advantageously entails less thermal load (heating) on the SOA than cw-operation, prevents mode-sticking as the laser is tuned, and allows for high pulse powers and low average powers, which is particularly advantageous when illuminating delicate samples or photoacoustic measurements.

The laser comprises particularly a means for pulsed pumping of the SOA.

According to another embodiment of the invention, the SOA has an extra-cavity facet that faces outwards the external laser cavity, particularly wherein in front of the extra-cavity facet a collimating or focussing optics, such as a lens, is arranged, particularly wherein the extra-cavity facet comprises a reflective or a reflection-reducing coating.

According to another embodiment of the invention, the laser comprises an optical fibre, particularly an optical fibre for the MIR range, wherein the said fibre is coupled to the output port facing the retro-reflecting beam splitter, particularly wherein a collimating, focussing lens is arranged between the beam splitter and the fibre or wherein no refractive element is arranged between the beam splitter and the fibre (butt-coupled).

According to another embodiment of the invention, the laser comprises an optical fibre, particularly an optical fibre for the MIR region, wherein the said fibre is coupled to the output port facing the extra-cavity facet of the SOA, particularly wherein a collimating, focussing lens is arranged between the extra-cavity facet and the fibre or wherein no refractive element is arranged between the extra-cavity facet and the fibre (butt-coupled).

According to another embodiment of the invention, a fibre-coupling device is arranged at the extra-cavity facet or at the beam splitter, such that a fibre can be attached to the laser.

According to another embodiment of the invention, the beam splitter or the collimating lens arranged at the extra-cavity facet are configured such that a collimated output beam has a beam waist diameter smaller than 3 mm at the output port, wherein the diameter is particularly defined by $1/e^2$ intensity of the beam.

According to another embodiment of the invention, the laser comprises a light detector or power meter, particularly for the MIR range, coupled to the output port of the beam splitter.

According to another embodiment of the invention, the laser comprises a light detector or power meter, particularly for the MIR range, coupled to the output port of the extra-cavity facet.

According to another embodiment of the invention, the clear aperture of the wavelength-selectable interference filter is less than 2000-times the selected laser wavelength in diameter.

The measured output power of the laser can be processed in real time and fed back to the laser such that the Fabry-Perot filter cavity length and/or pump-current of the SOA and/or cooling current of the laser is adjusted in a closed-loop, such that the laser emission is stabilized. The purposes of the output ports can quite obviously be interchanged.

According to another embodiment of the invention, the surface normals of the etalon surfaces and/or the reflective layers of the Fabry-Perot filter are arranged at angle with respect to the optical axis of the cavity of the laser, wherein said angle is particularly greater than 0.5° and smaller than 60°.

This embodiment allows for the reduction of parasitic laser light in the external cavity.

It is particularly possible that the etalon is tiltable with respect to the optical axis.

According to another embodiment of the invention, the external cavity length of the laser is less than 20 mm, particularly less than 10 mm, more particularly less than 8 mm.

This embodiment allows for miniaturized lasers. The cavity length is particularly the optical length of the cavity for one pass of laser light.

According to another embodiment of the invention, the beam splitter comprises a first plano-convex, particularly thick lens, wherein a cavity-inward-facing surface of the lens, that is the surface facing inward the cavity and thus, towards the wavelength-selectable interference filter, has a convex, particularly aspheric profile and a cavity-outward-facing surface of the lens is planar, wherein particularly the cavity-outward-facing surface normal is parallel to or coincides with the axis of rotation of the convex surface of the lens, and wherein the focal plane of the lens lies on the planar surface at least at the optical axis of the lens, wherein the planar surface is particularly coated with a reflective layer, wherein the convex surface is particularly coated with a reflection-reducing layer.

This beam splitter allows for on-axis, retro-reflected incident light in an advantageous and robust manner.

According to another embodiment of the invention, the beam splitter is configured such that light emitted from a surface of the beam splitter facing outwards the cavity is collimated or focused outside the beam splitter, wherein the beam splitter comprises particularly the first convex lens according to the previous embodiment of the invention, wherein particularly the beam splitter further comprises a second plano-convex lens whose planar cavity-inward-facing surface is arranged back to-back, particularly in contact, with the planar surface of the first plano-convex lens, wherein particularly the first and the second plano-convex lens are coaxially arranged, wherein the convex cavity-outward facing surface of the second plano-convex lens is particularly aspheric and/or coated with a reflection-reducing layer, wherein, if the beam splitter is configured to collimate the emitting light, particularly the focal plane of the second plano-convex lens is on the planar surface of the second plano-convex lens at least at the optical axis of the lens, wherein if the beam splitter is configured to focus the emitting light, the focal plane of the second lens is particularly inside the second convex lens and plane-parallel to its planar surface.

This embodiment allows for the generation of a focal spot outside the output port at the beam splitter or for collimated light at said output port.

According to another embodiment of the invention, the laser comprises means for pumping the SOA electrically, wherein the pumping means is configured either to pump the laser with short electrical pulses with a pulse duration between 5 ns to 1000 ns and duty cycles between 0.1% to 60% and/or for pumping the laser using a continuous, particularly modulated current for producing a continuous wave or pulsed-mode operation of the laser.

According to another embodiment of the invention, at least one of the SOA facets, namely the intra-cavity or the extra-cavity facet, has a reflection-altering optical coating particularly made of a single or multi-layer thin-film structure.

According to another embodiment of the invention, the SOA has a spectral gain region that spans over +−3%, particularly over +−5%, more particularly over +−10% of its central wavelength.

The central wavelength of the SOA, which is not necessary identical to the central wavelength of the wavelength-selectable interference filter, is the arithmetic mean of the upper and lower limits of the gain spectrum, i.e. tuning range in external cavity configuration. The gain spectrum is given by the transition energies of the electronic transitions in the active region of the SOA that are stimulated by photons to create further photons, thereby providing gain to the photons.

According to another embodiment of the invention, the SOA has a spectral gain region comprising the wavelength 4.1 μm, 4.6 μm, 5.7 μm, 8 μm, 9 μm, 10 μm, 11 μm, and/or 12 μm, wherein particularly said wavelength is particularly the central wavelength.

According to another embodiment of the invention, the SOA has a spectral gain region comprising the THz region.

According to another embodiment of the invention, the SOA comprises at least one of the following components: two output facets, namely the intra-cavity facet and the extra-cavity facet; a waveguide system; an electrical current path; a base substrate.

The two output facets have particularly planar surfaces that are particularly arranged orthogonally with respect to the longitudinal extension of the SOA, particularly the active region of the SOA.

In another embodiment, at least one of the output facets can be tilted with respect to the waveguide of the SOA that is the surface normal of the facet and the axis of the SOA waveguide form a non-zero angle. This configuration is particularly advantageous if reflection-reduction is required at the facet. The tilted facet can be combined with a reflection-reduction (AR-) coating for enhanced performance. Tilting one facet is typically achieved with a J-type waveguide as known in the art, tilting two facets is achieved with an S-type waveguide. The former is known as Single-Angled-Facet (SAF) in the art, the latter Double or Two-Angled-facet (DAF, TAF).

The waveguide system formed about the quantum well stack semiconductor structure is particularly comprised of optically conductive active and passive layers embedded in optically conductive passive material. The current path particularly comprises a plurality of electrically conductive elements arranged to form a serial electrical circuit through which electric current can pass. Said base substrate is particularly a layer of bulk crystal material having a matched crystalline structure or one with strain with respect to said quantum well stack semiconductor, said quantum well stack being compensated with respect to the strain to have an average crystal lattice constant that matches the crystal lattice constant of the substrate. The method of strain-compensation is well-known in the art and can have advantages with respect to QCL performance.

According to another embodiment of the invention, at least one feedback element is integrated with the gain medium.

Said feedback element is particularly characterized by Fresnel reflection between the gain medium and the surrounding medium (vacuum or gas).

Alternatively the laser according to the invention comprises the same components as the laser comprising the wavelength-selectable interference filter, but with the difference that the wavelength-selectable interference filter is replaced by the adjustable Fabry-Perot filter only. This alternative embodiment of a laser according to the invention particularly has an external cavity and at least the following components:

a semiconductor optical amplifier (SOA), particularly being part of the external cavity, comprising an intra-cavity facet facing towards a first, particularly refracting or reflecting, optical element for collimating a laser beam exiting the intra-cavity facet arranged at the intra-cavity facet of the semiconductor optical amplifier, a transmissive, wavelength-adjustable interference filter (IF), comprising at least a wavelength-adjustable Fabry-Perot filter (FPF), wherein the interference filter is arranged between the first optical element and the beam splitter, and wherein the components are arranged such that laser light comprising a selected laser wavelength can stably resonate in the external cavity, wherein an on-axis, retro-reflecting beam splitter is arranged at one end of the external cavity, wherein the Fabry-Perot filter is particularly a MEMS-Fabry-Perot filter.

It is noted that all previous embodiments of the laser comprising an etalon can be applied to this alternative laser configuration, as long as the embodiments do not comprise the etalon. All definitions and advantages apply in the same manner.

The problem according to the invention is furthermore solved by an infrared spectrometer comprising a laser according to the invention, wherein the infrared spectrometer particularly comprises means for detection of absorbed, scattered, transmitted, or reflected light, such as photoacoustic detection, photodetectors, pyroelectric detectors, or bolometers.

Furthermore, the problem according to the invention is solved by a method for filtering out-of-band laser modes with a laser according to the invention, wherein the laser is operated in pulsed-mode or continuous-wave mode (cw), wherein the pump power of the SOA is adjusted such that only laser modes within a wavelength band comprised in the Full-Width at Half-Maximum of the interference filter transmission peak (i.e. the etalon transmission band selected by the Fabry-Perot filter) are pumped to a degree that the laser operates above the lasing threshold and that the all laser modes outside the selected etalon transmission band, particularly also the ones spaced an integral multiple of the free spectral range of the etalon away from the selected laser wavelength, remain below the lasing threshold, wherein the Fabry-Perot filter is particularly tuned such that the central wavelength of the Fabry-Perot filter transmission and the central wavelength of said etalon transmission peak are identical particularly within a 2%.

This method is specifically designed for a laser according to the invention comprising an etalon.

The method allows for a monochromatic, particularly single-mode pulsed laser output, wherein the laser still remains wavelength-switchable.

The problem according to the invention is furthermore solved by a method for adjusting a laser wavelength with a laser according to the invention, comprising the steps of:
a) Arranging the etalon and the Fabry-Perot filter under a predefined angle with respect to an incident light beam comprising the selected laser wavelength,
b) Adjusting the distance of the Fabry-Perot filter cavity such that the selected wavelength is transmitted through the Fabry-Perot filter,
c) Determining an intensity for the transmitted light of the wavelength-selectable interference filter,
d) Changing the length of the Fabry-Perot filter cavity, such that the intensity of the transmitted light is maximized.

According to another embodiment the method further comprises the steps of:
altering the etalons optical cavity length, particularly by heating the etalon,
and perform step b) and c) of the method for adjusting a selected laser wavelength.

Further features and advantages of the invention shall be described by means of a detailed description of embodiments with reference to the Figures, wherein it is shown in FIG. 1 a Fabry-Perot filter with a first actuating device;

FIG. 2 a wavelength-selectable interference filter of a laser according to the invention comprising an etalon and a Fabry-Perot filter;

FIG. 3 transmission spectrum of the wavelength-selectable interference filter;

FIG. 4 a monolithic version of the wavelength-selectable interference filter;

FIG. 5 a laser according to the invention;

FIG. 6 an embodiment of the laser with butt-coupled fibre and detector;

FIG. 7 an embodiment of the laser as in FIG. 6 with reversed fibre and detector;

FIG. 8 an embodiment of the laser as in FIG. 7 with additional coupling optics;

FIG. 9 an embodiment of the laser as in FIG. 5 with free-space coupling optics; and FIG. 10 several embodiments of a retro-reflecting beam splitter.

FIG. 1 show a Fabry-Perot filter 100 that is part of the wavelength-selectable interference filter 1 according to the invention. FIG. 1a shows a top view, FIG. 1b shows an isometric view and FIG. 1c shows a cross-sectional view of the Fabry-Perot filter 100. FIG. 1d shows a cross-sectional view of the Fabry-Perot filter 100 with symmetric suspensions of mirror elements 101 and 102.

The Fabry-Perot filter 100 is a miniature, micro-machined and preferably electrostatically-tuned mid-infrared Fabry-Perot-type band-pass interference filter 100 comprising a first mirror element 101 with a first highly reflective layer 103 and a second mirror element 102 with a second highly reflective layer 104 on a suitable MIR-transparent substrate 107, such as silicon or germanium, facing each other with a gas-filled or evacuated gap (cavity) 106 between them and the gap 106 can be adjusted to distances 301 in the range of 0.1 µm to 10 µm by a first actuation device 200.

The term "highly reflective" refers to a reflectivity of particularly greater than 98%.

The reflective layers 103, 104 can be deposited using physical vapour deposition (PVD) or chemical vapour deposition (CVD) or any other suitable technique known in the art with appropriate pre- and post-treatment, e.g. thermal or chemical annealing, plasma oxidation and polishing, etc.

The Fabry-Perot filter 100 can be fabricated from two optically flat substrates 107 structured and coated using photolithographic techniques, thin film-deposition and subsequent wafer-bonding.

At least one, particularly both mirror elements 101 and 102 are moveable in a direction parallel to the surface normal 116 of their reflective layers 103, 104.

The mirror elements 101, 102 are attached to suspensions 202 that are designed as solid flexure joints, micro-machined from the substrate material 107. Alternatively, the suspensions 202 might include actuation means comprising piezo-crystals, magnetic forces or electrostatic forces.

The present embodiment is based on actuation with electrostatic forces using pairs of electrode panels or rings 203 and 204 adjacent to the reflective layers 103, 104.

Alternatively (not shown), individually operable pairs of actuation electrodes to individually control the spacing of the reflective layers in multiple points to reduce relative tilt (relative deviation from plane parallel) are arranged at the first and/or the second mirror element.

The distance 301 (cavity length of the Fabry-Perot filter 100) is measured capacitively and can be adjusted either through one-time or recurring calibrations or in real time allowing closed-loop positioning.

The minimum and maximum displacement of the movable parts of the Fabry-Perot filter 100 is limited by use of mechanical stoppers 205, to protect the component against mechanical shock and the pull-in effect of the electrodes at large actuation voltages that can result in collision of the reflective surfaces.

According to another embodiment, two movable mirror elements are designed symmetrically, e.g. with nearly identical mass and suspension particularly to compensate the spacing for external forces such as acceleration and gravitation, see FIG. 1d.

The suspension can be designed as extruded parallelograms that only allow parallel motion (not shown).

The mirror elements 101 and 102 are thicker than 10 micrometres to effectively reduce curving due to the coating stresses of the respective reflective layer 103, 104.

The surfaces 108 and 109 of the mirror elements 101 and 102 facing outwards the Fabry-Perot cavity 106 are coated with a reflection-reducing optical thin-film coating structure.

Alternatively, other means of reflection reduction such as physical sub-wavelength structuring or mounting the wavelength-selectable interference filter at the Brewster angle can be used.

The clear aperture of the Fabry-Perot filter 100 is less than 10 mm2, particularly less than 4 mm2.

The entire Fabry-Perot filter 100 structure is smaller than 10 mm×10 mm×1 mm.

FIG. 2a shows a filter according to the invention, wherein the Fabry-Perot filter 100 and the etalon 110 are separate components comprised by the wavelength-selectable interference filter 1.

The Fabry-Perot filter and the etalon substrates 107, 115 are made from silicon. The etalon 110 has two plane-parallel surfaces 111, 112 that are coated with reflection-enhancing layers 114 for the MIR range or left blank to exhibit Fresnel-reflection.

The etalon surfaces 111, 112 are also parallel to the first and second reflective layer 103, 104 of the Fabry-Perot filter 100 or are mounted at a non-zero angle.

The Fabry-Perot filter 100 comprises a first and a second mirror element 101, 102 that are arranged on a MEMS 201. The first mirror element 101 comprises the first reflective layer 103 and the second mirror element 102 comprises a second reflective layer 104 that are plane-parallel to each other.

The backsides 108, 109 of the mirror elements 101, 102 are AR-coated.

With regard to an incident light beam, the reflective layers 103, 104 and surfaces 111, 112 are tilted with their surface normal by a few degrees.

Between the etalon 110 and the Fabry-Perot filter 100 is a gap.

The cavity length 301 of the Fabry-Perot filter 100 can be adjusted by the MEMS 201, wherein the etalon cavity length 302 is fixed.

FIG. 2b shows another embodiment of a filter according to the invention, wherein the Fabry-Perot filter 100 and the etalon 110 are separate components comprised by the wavelength-selectable interference filter 1.

The cavity lengths 301 of the Fabry-Perot filter 100 and 302 of the etalon 110 can be adjusted by the MEMS.

FIG. 3a shows a typical transmission characteristic of the etalon (dotted line) and of the Fabry-Perot filter, tuned to two different positions (solid and dashed lines).

FIG. 3b shows the transmission of the wavelength-selectable interference filter, i.e. the combined transmission of Fabry-Perot filter 100 and etalon 110 when inserted into the external cavity according to the invention, that is a product of the transmission characteristic of Fabry-Perot filter and etalon for two passes through the wavelength-selectable interference filter, for two different wavelength settings of the Fabry-Perot filter. The situations depicted, illustrates how the Fabry-Perot filter selects the transmission peak of the etalon at 1111 cm-1 at the first setting (dashed line) and at 1148 cm-1 at the second setting while blocking all other transmission peaks.

FIG. 3b illustrates how the overall transmission through the wavelength-selectable interference filter has a bandwidth that is equal to the bandwidth of each etalon transmission peak and is far smaller than the bandwidth of the Fabry-Perot transmission. The suppression of the adjacent transmission peaks 502 of the etalon 110 (side mode suppression) increases with increasing FSR of the etalon 110 and with decreasing Fabry-Perot filter bandwidth. The suppression of side modes 502 also increases with the number of passes through the wavelength-selectable interference filter 1.

In some embodiments of the invention, the SOA is pumped to a degree where the resonator losses of the suppressed side modes 502 prevent sustained oscillation (laser action) of the side modes, while the selected transmission peak 501 is above lasing threshold (laser action). Thus, laser emission is confined to the transmission peak 501 of the etalon 110 selected by the Fabry-Perot filter 100.

By adjusting the cavity length 301 of the Fabry-Perot filter 100, the wavelength of the laser can be tuned digitally to another transmission peak of the etalon 110 (c.f. e.g. FIG. 3)

In FIG. 4 a filter 1 according to the invention is shown, where the etalon 110 is an integral part of the Fabry-Perot filter 100.

The first mirror element 101 of the Fabry-Perot filter 100 has a reflective first layer 103 (111) and a plane-parallel, reflective second layer 108 (112), both being highly reflective. The first reflective layer 103 (111) contains means for phase-matching the light reflections inside the air cavity to the reflections inside the etalon cavity.

The substrate 107 (115) of the first mirror element 101 (110) is transparent and has a thickness between 10 μm and 1000 μm. The first mirror element 101 therefore comprises all properties that the etalon 110 comprises as well as indicated by the numbers in brackets. Therefore, the first mirror element 101 comprises or is the etalon 110.

This embodiment is particularly robust against misalignment of the etalon 110 with respect to the Fabry-Perot filter 100. However temperature stabilization is slightly more complex.

The spacing of the transmission modes of the etalon 110 is of several cm-1. Therefore the modes are well-discriminable by the precision the Fabry-Perot filter 100 achieves with regard to its cavity length 301.

The (temperature-controlled) etalon 110 spreads out the allowed resonance frequencies to several narrow and well-defined emission modes spaced at several cm-1 to be selected by the Fabry-Perot filter 100. This improves beam quality and wavelength accuracy and facilitates electronic and computational handling at the apparent cost of allowing fewer digitally-tuned modes.

FIG. 5 to FIG. 9 show various embodiments of a laser 10 according to the invention. FIGS. 5a to 9a depict the laser 10 in a top view, wherein FIGS. 5b to 9b depict the laser 10 in isometric view.

The laser 10 comprises a SOA 12 for the MIR region, such as a QCL.

The SOA 12 is soldered epi-side up or down on a high-thermal conductivity submount 2, made particularly from Aluminium nitride, AlN, or a similar high-thermal conductivity material. The submount 2 is mounted on the base structure 3. The base structure 3 is made from a material of high thermal conductivity and thermal contactability, such as gold-plated, polished copper. Good thermal contact is ensured through use of high-thermal conductivity glue, solder, thermal paste or similar. The base structure 3 has two functions, serving simultaneously as a compact high-rigidity mechanical structure to which all optical components are fixed securely and as a heat spreader and heat sink due to its high thermal conductivity and high thermal mass.

The base structure 3 is mounted on a thermo-electric cooler (TEC) 4, which in turn can be in thermal contact with the inside of a housing structure (not shown).

The thermos-electric cooler 4 in conjunction with appropriately placed temperature sensors and control electronics is configured to stabilize the temperature of the laser 10 and optical components near room temperature (or any other ambient temperature).

The laser 10 can be incorporated in a very compact housing (not shown) that is hermetically sealed and contains an inert gas, air or vacuum to suppress intra-cavity absorption or, in case of cooling the laser to lower temperatures, water vapour condensation on any of the optics. It is a particular feature of the invention that the entire housing can, in extreme cases, be made smaller in dimensions than 6 mm×6 mm×6 mm including all the necessary components for tuning and cooling.

Since the SOA 12, when driven in pulsed-mode, represents a comparatively small thermal load and the temperature difference between set and ambient temperatures is small, external intentional heat extraction with cooling water or fans is obsolete, and heat extraction can be performed passively through the body of the housing (not shown).

The SOA 12 is electrically contacted and pumped using controller electronics (not shown), preferably in short pulses of 5 ns-1000 ns duration to assure fast wavelength switching capability without mode "sticking". Pulsed mode operation furthermore assures small power consumption, and a high lasing efficiency as the operating temperature in pulsed-mode is nearly equal to the heatsink temperature. Besides this, the pulsed-mode operation grants a broader tuning range.

The SOA 12 has two emission facets, the extra-cavity facet 122 and the intra-cavity facet 121. The extra-cavity facet 122 has any reflectivity advantageous to the emission (in the range between 2% and 100%) either achieved through appropriate optical coatings or through making use of the as-cleaved crystal Fresnel reflectivity of approximately 28%. Higher reflectivity results in lower laser resonator losses through the extra-cavity facet 122 but also in lower laser emission.

The intra-cavity facet 121 has a low reflectivity which is achieved through a suitable anti-reflection-coating of the intra-cavity facet 121.

The extra-cavity facet 122 is the first end mirror (reflector) of the laser resonator. Transmitted light leaves the resonator through the extra-cavity facet 122 from a single well-defined focal point, as the facet 122 has dimensions comparable to the wavelength of the light. This facilitates further handling, such as collimation, fibre coupling or re-focussing. The exiting light can be either a primary beam (c.f. e.g. FIG. 7 or FIG. 8) or a secondary beam directed towards a detector 5 (c.f. e.g. FIG. 6). If no secondary output is required and the retro-reflector is chosen as the primary output port, the extra-cavity facet can be coated with a highly reflective coating.

Light emitted from the intra-cavity facet 121 is collimated using a thick aspheric, plano-convex collimation lens 130. The focussing power of the lens 130 is reduced by virtue of its thickness and a high refractive index material such as silicon which increases manufacturing and alignment tolerances while minimizing the beam width of the collimated beam. The lens 130 has an AR-coating on its planar surface 131 and an AR-coating on its convex surface 132.

After the lens 130, the Fabry-Perot filter 100 is arranged in the external cavity 11, whose reflective layer's surface normals are at an angle with respect to the optical axis 300 of the external cavity 11. Wavelengths within the wavelength-selectable interference filter's passband are transmitted while out-of-band wavelengths are specularly reflected out of the laser resonator.

Next to the Fabry-Perot filter 100 the etalon 110 is arranged. The wavelength range of the beam transmitted by the etalon 110 is confined to narrow transmission peaks, while all other wavelengths are specularly reflected. Naturally, the order of arrangement of Fabry-Perot filter 100 and etalon 110 can be reversed.

The etalon 110 thickness is chosen such that only a single transmission peak lies close to the wavelength-selectable interference filter's transmission maximum, while all other transmission peaks are strongly suppressed resulting in a single, very narrow transmission line of the wavelength-selectable interference filter 1.

At the end of the external cavity 11, an on-axis, retro-reflecting beam splitter 14 is arranged. The beam splitter 14 has a convex surface 142 that is configured to focus impinging light onto a planar surface 143 on a focal plane 140F of the beam splitter 14. The convex surface 142 is coated with an AR-coating, while the planar surface 143 has medium to high reflectivity having either a reflectivity-increasing coating or the Fresnel reflectivity of the uncoated surface.

A fraction of the impinging light is reflected by reflective surface 143, 140R of the beam splitter 14, completing the external cavity 11. Since the reflected fraction is reflected parallel, on-axis along the direction of the impinging beam, the laser design is very insensitive to misalignment.

Another fraction of the impinging light is transmitted by the beam splitter 14, leaving the external cavity 11 as narrow-band laser light, preferably in a single laser mode. The transmitted light leaves the external cavity 11 from a single well-defined focal point on the planar surface 143 of the beam splitter 14. Additional components can be arranged at the planar surface 143 of the beam splitter 14 that facilitate further handling, such as collimation (c.f. e.g. FIG. 9), fibre-coupling (c.f. e.g. FIG. 6), detection (c.f. e.g. FIG. 7) or re-focussing (c.f. e.g. FIG. 8). The transmitted light can be either a primary laser beam (c.f. e.g. FIG. 5, 6 or 9) or a secondary laser beam directed towards a detector 5 for monitoring purposes (c.f. e.g. FIG. 7 or FIG. 8). If no secondary output is required and the extra-cavity facet is chosen as the primary output port, the beam splitter can be coated with a highly reflective coating.

The beam splitter 14 is made of a high refractive index material such as chalcogenide glass, ZnSe, Si, Ge, GaAs, InP, which again reduces manufacturing tolerance. The high refractive index of the beam splitter 14 also has the advantage that the focal point moves only very slightly with varying entrance angle (through unintentional misalignment by mechanical shock or dynamically during operation), thereby increasing coupling to following static optics such as infrared fibres.

Therefore, a particular advantage of the invention is the fact that, if the core diameter of a fibre 6 that is to be coupled to the laser 10 is chosen sufficiently large, with typical diameters ranging between 100 μm to 1000 μm, the coupling of the light into the fibre 6 is constant regardless of dynamic intra-cavity misalignments and allows for greatly simplified initial alignment.

It is pointed out explicitly, that some applications may not call for a wavelength accuracy that requires temperature stabilization. Due to the small thermo-optic coefficient of the etalon 110, a high degree of wavelength accuracy can be achieved even without temperature stabilization. In this case the thermoelectric cooler 4, thermal sensors and TEC control electronics can be omitted resulting in further reduced device complexity.

Lens 130, Fabry-Perot filter 100, etalon 110 and beam splitter 14 can be fixed in place using UV cured glue. It is pointed out explicitly that the design is sufficiently alignment insensitive that, given sufficiently narrow manufacturing tolerances of the base structure 3, the optical components do not require precise alignment using micro-positioners, with the one exception of the distance between intra-cavity facet 121 and lens 130, which can easily be slid in place by maximizing emission power from the laser 10.

FIGS. 6a and 6b show an embodiment of the invention that makes use of both output ports of the laser 10 as well as the fact that both output ports are focused to well-defined focal points. In addition to the laser 10, in FIGS. 6a and 6b, a fibre 6 is directly butt-coupled to the focal point of the retro-reflecting beam splitter 14. On the other output port an infrared detector 5 is directly arranged in front of the extra cavity facet 122. The fibre 6 is attached using an SMA connector.

FIGS. 7a and 7b show an embodiment of the invention similar to the one from FIGS. 6a and 6b, with the difference that the fibre 6 and detector 5 locations are switched. This highlights the fact that given adjusted reflectivity of extra-cavity facet 122 and the planar surface 143 of the beam splitter 14, the primary and secondary output ports of the laser 10 can be interchanged. It is also possible to couple two fibres to the laser, one to each output port (not shown).

FIGS. 8a and 8b show another embodiment of the invention using re-focussing optics 18 and 147, 155. The lens 18 re-focusses the beam emitted from the extra-cavity facet 122 to the fibre 6. This is advantageous to increase the coupling to very thin fibres, if the fibre port 20 does not allow for precise adjustment. In this case, lens 18 can be aligned using a micro-positioner and fixed in place to allow for an additional degree of freedom during setup. Lens 18 can be similar or identical to collimating lens 130.

Figure 10A:
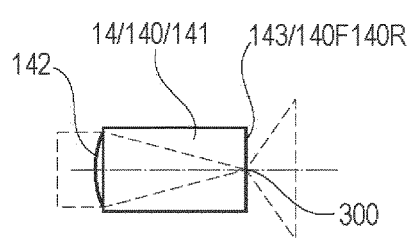
Figure 10B:
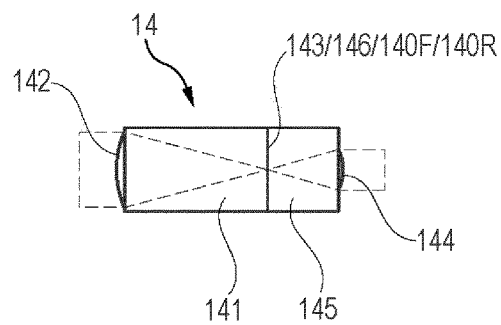
Figure 10C:
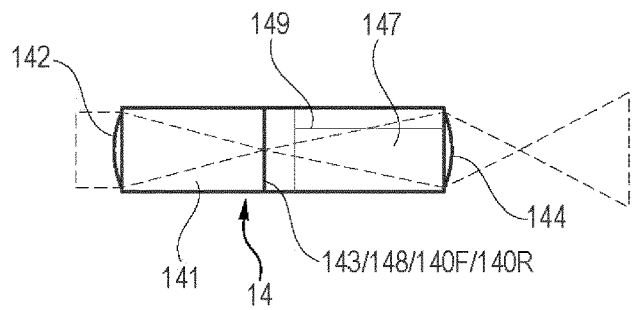
Figure 10D:
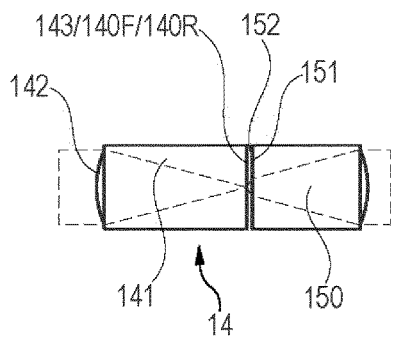
Figure 10E:
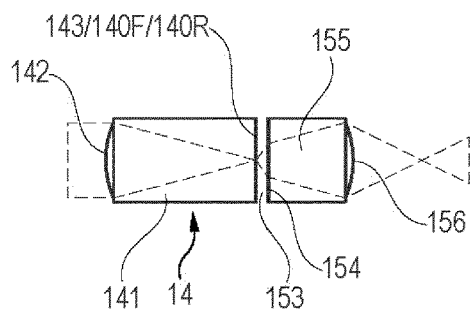

The re-focussing optics 147, 155 are described in the embodiment corresponding to FIG. 6e and in the embodiment corresponding to FIG. 10c and in the embodiment corresponding to FIG. 10e of the beam splitter 14. The re-focussing optics 147, 155 can be adjusted to fully illuminate the detector area, in case the detector port 21 does not allow for precise adjustment.

Obviously, fibre 6 and detector 5 may be interchanged. In case the re-focussing optics 147, 155 is the thick lens, the thick lens can be similar or identical to collimating lens 130.

In summary, embodiments in FIGS. 6 to 8 intricately make optimal use of typical sizes found in semiconductor lasers: The focus to the SOA intra-cavity facet 121 is stabilized through the on-axis, retro-reflecting beam splitter 14, while the focus to the fibre 6 does not need to be stabilized, because fibres typically have a 15-150 times larger diameter than the focal spot at the beam splitter 14 or the extra-cavity facet 122 respectively. Particularly with the use of miniaturized intra-cavity optics, the diameter of the fibre 6, typically around 300 µm-1000 µm, becomes large relatively, making fibre coupling trivial.

Figure 9B:
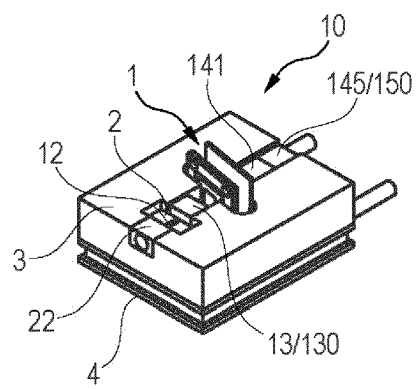

FIGS. 9a and 9b show an embodiment of the invention using collimating optics 22 and 145, 150.

The lens 22 collimates the beam emitted from the extra-cavity facet 122. Lens 22 can be similar or identical to collimating lens 130.

The collimating optics 145, 150 are described in the embodiment corresponding to FIG. 10d and in the embodiment corresponding to FIG. 10b of the beam splitter 14. In case the collimating optics 145, 150 is a thick lens, the lens can be similar or identical to collimating lens 130.

Quite obviously, all different combinations of coupling light out of any of the output ports are intended by the invention.

In the following, further details of the laser components shown in FIGS. 5 to 9 are detailed.

The QCL is formed from narrow linear stripes, "ridges", of approximately 5 µm to 50 µm width etched into an optically passive but conductive semiconductor substrate. The active region is approximately 2 µm to 10 µm high. The SOA 12 comprises one or more such ridges of typically between 0.2 mm and 10 mm length, wherein the QCL is terminated by a cleaved or etched surface and parallel to the surface normal or with an angle between ridge and surface normal for particularly advantageous reflection reduction. The area that is the intersection of the active region volume with the cleaved or etched crystal plane is called the "facet" 121, 122 of the QCL. The partial (Fresnel) reflectivity of the facets 121, 122 causes internally generated light to resonate through the active region, the active region serving as a light-confining waveguide, while a fraction of it is continuously lost through the facets in the form of emitted laser light.

To create a SOA from a QCL, the internal resonance has to be suppressed. This is done by reducing the reflection of at least one of the facets, for example with an AR-coating, and pumping the active region below lasing threshold.

Since the light exits the active region of the SOA 12 through a facet 121, 122 whose dimensions is comparable to or smaller than the wavelength of the emitted light, the emitted light is highly divergent with opening angles in the fast-diverging axis of up to approximately 90°.

The SOA 12 can be optically pumped, however, in this exemplary embodiment the SOA 12 is pumped electrically either with short pulses of 5 ns-1000 ns duration and duty cycles of approximately 0.1%-60% or using a continuous DC current, known as CW (continuous wave) operation. The latter can have any modulation superimposed on it (obviously a modulation with very short on-off pulses would then be termed pulsed-mode and not CW).

The SOA 12 can have an output optical power of several µW to several W of average power or several W to several tens of W during short pulses.

First optical element 13/collimating lens 130

The collimating lens 130 is a miniaturized, thick, high-numerical aperture, aspheric, plano-convex lens 130 made of an infrared-transparent material (such as Si, Ge, chalcogenide glass, ZnSe, ZnS, etc.) with a short focal distance on the planar side 131.

The collimating lens 130 has the advantage of reduced dioptric power compared with thin lenses of the same curvature which increases manufacturing and alignment tolerances.

The collimating lens 130 is designed to have a high-numerical aperture to collect a large fraction of the light emitted from the intra-cavity facet 121 of the SOA 12. Moreover, the lens 130 is designed to result in a small collimated beam diameter in the range of one to one hundred wavelengths for miniaturization and improved resonator coupling.

Although smaller apertures result in larger angular spread of the collimated beam, within the external cavity 11 this can be tolerated to a comparatively large degree, due to the comparable short length of the free-space cavity 11, namely 1 mm to 20 mm.

Indeed, the free-space portion of the external cavity 11 is exceptionally short and the largest distance the light is travelling is covered within the collimating lens 130 and the beam splitter 14. Both components are made of high refractive index materials that reduce the angular spread of the collimated light considerably.

In particular, the collimating lens 130 has a working distance on its planar surface 131 of less than 0.3 mm, a numerical aperture greater than 0.7 in air, a clear aperture of less than 3 mm, a thickness of less than 3 mm, and it is coated with an AR coating on both surfaces—the planar surface 131 and the convex surface 132.

Alternatively, the collimating lens 130 has a clear aperture of 2 mm, a thickness of 3 mm, and a residual semi-divergence of 10 arcmin for a wavelength of 9 µm.

The curvature profile of the collimating lens 130 can be described by a rotationally symmetric convex aspheric surface characterized by the equation $$z = \frac{\frac{r^2}{R}}{1 + \sqrt{1 - (1+k)\frac{r^2}{R^2}}}$$

where z is the sag, r is the distance from the optical axis and the parameters R=−2.450 are the curvature and k=−1742 the conic constant.

Etalon 110

The etalon 110, also referred to as the mode spreader or frequency normal, is made of a homogenous, solid substrate 115 of MIR-transparent material, such Si, Ge, chalcogenide glass, ZnSe, ZnS, etc. with plane-parallel optically flat surfaces (better than lambda/20), namely the first and the second surface 111, 112. The substrate 115 acts as an etalon cavity 113 and the reflections from the reflective layer 114 on the first and second surface 111, 112 of the etalon 110 leads to the interference that results in wavelength-dependent transmission through the etalon 110.

If no reflection enhancing coating, in form of a reflective layer 114 is arranged on the surfaces 111, 112 of the etalon 110, the substrate 115 would also acts as an etalon cavity 113 and the Fresnel reflections on the first and second surface 111, 112 of the etalon 110 would lead to the interference that results in wavelength-dependent transmission through the etalon 110. The etalon 110 with no additional reflective layer 114 has a high index of refraction (typically between 2 and 4.2) to result in a high Fresnel reflection coefficient at the surface-ambient boundary.

In this example, the first and second surface 111, 112 of the etalon 110 have reflective layers 114 deposited on them, such as thin film distributed Bragg reflectors or subwavelength structured gratings.

Correspondingly, the substrate's refractive index can also be lower (for example below 2).

The etalon 110 exhibits periodically recurring transmission bands in frequency (or in inverse wavelength) space, allowing them to be numbered, i.e. the order of transmission. The frequency space (or wavelength range) between the bands is termed the free spectral range FSR.

The transmission bands have a resonant shape with a linewidth of FSR/F. Here F, the finesse, is a homogeneously increasing function of the reflectivity R of the surfaces. A reflectivity R close to 100% results in large value for the finesse F, in the order of 100 to 10.000 and correspondingly a transmission band with a comparable narrow bandwidth (a few nanometres).

For use as a wavelength normal, the etalon 110 can be thermally stabilized which results in very good wavelength stability of the transmission bands.

In the optical path of the external cavity 11, the etalon 110 is arranged in a tilted fashion with respect to the optical axis 300 so that the surface normal of the first and second surface 111, 112 of the etalon 110 are not parallel to the optical axis 300 of the resonator. This arrangement reduces the amount of back-reflected, out-of-band light into the laser resonator and eliminates parasitic oscillations.

In a preferred embodiment of the invention, the etalon is integrated into the micro-machined filter. This can be done by particularly replacing the anti-reflection coating of the backside (facing away from the Fabry-Perot cavity) of at least one of the mirror elements, for example the first mirror element, with a reflection-increasing coating. The reflective surface layer, for example the DBR layer structure, on the Fabry-Perot filter cavity-facing side of the respective mirror element can be altered to account for correct phase matching between the air cavity and the substrate cavity and to symmetrize the substrate cavity, as is known in the art.

In another embodiment, the backside anti-reflection coating of at least one of the mirror elements, for example the first mirror element is simply omitted and Fresnel-reflection is used instead. In this case the reflective surface layer, for example the DBR layer structure, on the cavity facing side of the respective mirror element can be altered to account for correct phase matching between the air cavity and the substrate cavity.

In another embodiment, the etalon can be made of a micro-actuated air-gap Fabry-Perot filter like the one described above, but operated in high cavity order like the etalon in other embodiments. This reintroduces continuous fast tuning at the cost losing the well-defined frequency normal. In this case, wavelength repeatability is limited by the repeatability of the wavelength-selectable interference filter central wavelength.

The etalon 110 can be equipped with a heater (not shown) to vary the refractive index of the substrate 115 through the thermo-optic effect. This varies the position of each transmission peak and also the FSR. Although the thermo-optic coefficient is comparably small, e.g. $2*10-4/K$ for silicon at room temperature, the tuning ranges of each individual transmission peak can be made to overlap by spacing adjacent modes close by choosing a thicker substrate 115.

For instance, within a temperature range of 50 K the optical thickness varies by ~1%, requiring filter order>100, which for 9 μm corresponds to a thickness of a silicon etalon 110 of ~130 μm. This principally allows continuous tuning capability, however, large temperature ranges and fast thermal variations are required, causing great stresses for the coatings. Reducing the temperature range increases the required thickness resulting in larger tuning time constants.

FIGS. 10a-10e show several embodiments of the retro-reflecting beam splitter 14 made of a single component for maximum ruggedness or two components for added flexibility. Broken lines depict light travelling through the beam splitter 14.

FIG. 10a shows a monolithic beam splitter 14 that is transparent in the MIR range, comprising for example Si, Ge, chalcogenide glass, ZnSe, ZnS. The beam splitter 14 shown is a cat's eye type beam splitter having an aspheric, convex front surface 142, i.e. the cavity-inward-facing surface and a planar rear surface 143, i.e. the cavity-outwards-facing surface. The rear surface normal is parallel to the axis of rotation of the convex front surface 142 and crosses the focal point of the front surface 142. Therefore, for sufficiently paraxial rays at a sufficiently small inclination with respect to the optical axis 300, the rear surface is identical to the focal plane 140F. For rays that do not fulfil the paraxial requirement, slight deviations of the focal plane 140F and the rear surface 143 are to be expected.

The aspheric surface 142 of the beam splitter 14 is particularly designed to have a small Petzval curvature. The aspheric surface 142 is provided by a thick, high-numerical aperture, aspheric, plano-convex lens 141 (similar to the collimating lens 130) of an infrared-transparent material (such as Si, Ge, chalcogenide glass, ZnSe, ZnS, etc.), whose planar surface 143 is identical to the focal plane 140F of the aspheric convex surface 142 as detailed above. The convex front surface 142 of the beam splitter 14 comprises an AR-coating, the planar surface 143 of the beam splitter, has a reflective layer 140R, with a reflectivity between 28% and 100%.

Since the transmitted light of the beam splitter 14 passes through a well-defined focal point on the rear surface 143, fibre-coupling can be achieved through simple butt-coupling, rendering the beam splitter 14 also a partially transmissive, retro-reflecting, fibre-coupler.

It is a particular feature of the beam splitter 14 that due to the high refractive index of the beam splitter material, the focal point of the beam splitter 14 moves only small distances with varying entrance beam angles due to unintentional misalignment due to mechanical shock or during operation.

The beam splitter 14 of FIG. 10a has a thickness of 3.919 mm and has a rotationally symmetric, convex front surface 142 profile characterized by the equation $$z = \frac{\frac{r^2}{R}}{1 + \sqrt{1 - (1+k)\frac{r^2}{R^2}}}$$

where z is the sag, r is the distance from the optical axis and the parameters R=−2.450 are the curvature and k=−1742 the conical constant.

FIG. 10b shows an embodiment of a retro-reflecting beam splitter 14 configured for producing collimated light at its output. The beam splitter 14 is made of two components 141, 145 each being similar to the beam splitter 14 of FIG. 6a. The two components 141 are joined at their respective planar surfaces 143, 146 that are identical to their respective focal planes 140F as described previously. The two components 141, 145 need not be identical but can have different thicknesses and surface curvatures, resulting in different beam diameters on either side. A reflective layer 140R with a reflectivity between 20% and 90% is located between the components 141, 145 at the coinciding focal planes 140F of the two components 141, 145. The layer can have any form known in the art, such as a DBR, sub-wavelength structured reflector, or simply a thin metallic film.

FIG. 10c shows an embodiment of a retro-reflecting, on-axis beam splitter 14 configured for focussing the transmitted light outside the beam splitter 14, e.g. for fibre coupling purposes. The beam splitter 14 comprises two components 141, 147 each being similar to beam splitter 14 in of FIG. 10a that are joined at their respective planar surfaces 143 148. The second, re-focussing component 147 is thicker than the focal distance 149 of its aspheric surface 144. Thus, the focal plane lies within the re-focussing component 147 resulting in focussing to a point outside the re-focussing component 147 rather than collimation. In other words, the focal plane of the first component 141 is identical to the object plane of the second component 147. A reflective layer 140R with a reflectivity between 20% and 900% is located at the planar surfaces 143, 148 of the first and/or second component 147. The layer 140R can have any form known in the art, such as a DBR, sub-wavelength structured reflector, or simple thin metallic film.

FIG. 10d shows an embodiment of a beam splitter similar to the embodiment of FIG. 6b, but with the difference that a gap 152 is between the planar surfaces 143, 151 of the two components 141, 150, i.e. the planar surfaces 143, 151 do not touch. The second component 150, i.e. the component collimating the exiting light beam, is a thick high-numerical aperture, aspheric, collimating lens positioned such that its focal plane is identical to the focal plane 140F of the first component 141. This lens can be identical or similar to the lens 130. The lens is coated with a suitable anti-reflection coating.

FIG. 10e shows an embodiment of a beam splitter 14 similar to the embodiment of FIG. 10c, but with the differences that a gap 153 is located between the planar surfaces 143, 154 of the two components 141, 155, i.e. the planar surfaces do not touch. The second component 155, i.e. a thick, high-numerical aperture, aspheric, focussing lens is positioned such that its object plane is identical to the focal plane 140F of the first component 141. This re-focussing lens can be identical or similar to the lenses 130. To avoid wave front errors, the convex surface 156 can be modelled for desired object and image planes. The lens is coated with a suitable anti-reflection coating. This embodiment allows for a shorter design of the beam splitter 14.

REFERENCES

[1] J. Faist et al. Quantum cascade laser. Science, 264 (5158), 553:556, (1994)
[2] C. Gmachl et al. Rep. Prog. Phys. 64, 1533 (2001)
[3] A. Kosterev et al. Appl. Phys. B 90, 165 (2008)
[4] J. Faist et al. Appl. Phys. Lett. 70, 2670 (1997)
[5] X. Baillard et al. Opt. Commun. 266, 609 (2006)
[6] P. Buerki et al. "Swept sensor™—a novel port-able battery-operated gas sensing solution," http://www.daylightsolutions.com/assets/003/5245.pdf

The invention claimed is:

1. Wavelength-switchable, semiconductor laser (10), for generating of laser light in the optical mid-infrared range between 3 μm and 50 μm, wherein the laser (10) comprises an external cavity (11) and at least the following components:
   a semiconductor optical amplifier (12) comprising a Quantum Cascade Laser, QCL, for the mid-infrared region, comprising an intra-cavity facet (121) facing towards
   a first optical element (13) for collimating a laser beam exiting the intra-cavity facet (121) arranged at the intra-cavity facet (121) of the semiconductor optical amplifier (12),
   a transmissive, wavelength-adjustable interference filter (1), comprising at least
      i) a wavelength-adjustable Fabry-Perot filter (100) and
      ii) an etalon (110) comprising a first planar surface (111) and a second planar (112) surface, wherein the first and second surface (111, 112) of the etalon (110) are arranged opposite and plane-parallel to each other and delimit an etalon cavity (113),
   an on-axis retro-reflector (14) arranged at one end of the external cavity (11),
   wherein the etalon (110) and the Fabry-Perot filter (100) are arranged in a row, wherein the interference filter (1) is arranged between the first optical element (13) and the on-axis retro-reflector (14), and
   wherein the components of the interference filter (1) are arranged such that laser light comprising a selected laser wavelength can stably resonate in the external cavity,
   wherein the Fabry-Perot filter (100) comprises a first and a second mirror element (101, 102) that are arranged on a micro-electro-mechanical system (201), MEMS, such as to alter the distance (301) between them,
   wherein a first reflective layer (103) comprised by the first mirror element (101) and a second reflective layer (104) comprised by of the second mirror element (102) are plane-parallel to each other,
wherein a free spectral range of the etalon for the selected laser wavelength is at least 10 times smaller than a free spectral range of the Fabry-Perot filter for the selected laser wavelength, and
wherein the etalon and the Fabry-Perot filter are arranged such that for an incident light beam comprising the selected laser wavelength, a full-width half-maximum of a transmission band of the selected laser wavelength of the etalon is at least 5 times smaller than the full-width half-maximum of the transmission band of the Fabry-Perot filter.

2. The laser according to claim 1, wherein the Fabry Perot MEMS comprises
a first actuation device (200), wherein the first mirror element (101) and/or the second mirror element (102) are arranged on the first actuation device (200) such that the first reflective layer (103) and the second reflective layer (104) are arranged opposite and plane-parallel to each other, such that the reflective layers (103, 104) delimit a Fabry-Perot cavity (106), wherein the first actuation device (200) is configured to adopt at least a first position and a second position, wherein in the first position the distance (301) between the first and the second reflective layer (103, 104) is greater than in the second position.

3. The laser according to claim 1, wherein the etalon cavity (113) comprises a transparent, solid substrate (115), and wherein the first and the second surface (111, 112) of the etalon (110) are comprised by the substrate (115) or wherein the first and/or the second surface (111, 112) of the etalon (110) are a reflective layer (114) on the substrate (115).

4. The laser according to claim 1, wherein the etalon cavity (113) is gas-filled or evacuated and wherein the etalon cavity length (302) between the first and the second surface (111, 112) of the etalon (110) is adjustable.

5. The laser according to claim 1, wherein the Fabry-Perot filter (100) has a Finesse greater than 50.

6. The laser according to claim 2, wherein the etalon (110) is comprised by the first mirror element (101) of the Fabry-Perot filter (100), wherein the first mirror element (101) comprises the transparent substrate (115) of the etalon (110) and wherein the first surface (108, 114) of the etalon (110) is the reflective layer (103) of the first mirror element (101).

7. The laser according to claim 1, wherein the on-axis retro-reflector (14) is a cat's eye retro-reflector, comprising a refractive element (140) with a reflective surface (140R) and a focal surface (140F), wherein the refractive element (140) is configured such that the focal surface (140F) of the refractive element (140) coincides at least partially with the reflective surface (140R).

8. The laser according to claim 1, wherein the first optical element (13) is a collimating lens (130) with a numerical aperture greater than or equal to 0.5.

9. The laser according to claim 7, wherein the on-axis retro-reflector (14) comprises a first plano-convex lens (141), wherein a cavity-inward-facing surface (142) of the lens (141) has a convex surface profile and a cavity-outward-facing surface (143) of the lens (141) is planar, wherein the focal plane (140F) of the lens coincides with the planar surface (143).

10. Laser according to claim 9, wherein the on-axis retro-reflector (14) is configured such that light emitting from a surface (144) facing outwards the cavity is collimated or focused outside the on-axis retro-reflector (14), wherein the on-axis retro-reflector (14) further comprises a second plano-convex lens (145, 147) whose planar, cavity-inward-facing surface (146, 148) is arranged back to-back with the planar surface (143) of the first plano-convex lens (141).

11. The laser according to claim 1, wherein the laser (10) comprises means for pumping the semiconductor optical amplifier (12) electrically, wherein the pumping means is configured either to pump the laser (10) with short electrical pulses with a pulse duration between 5 ns to 1000 ns and duty cycles between 0.1% and 60% and/or for pumping the laser using a continuous current for producing a continuous wave or pulsed-mode operation of the laser (10).

12. The laser according to claim 1, wherein the on-axis retro-reflector is semi-transparent.

13. The laser according to claim 12, wherein the on-axis retro-reflector has a reflectance of less than 95%.

* * * * *